United States Patent
Arfaei Malekzadeh et al.

(10) Patent No.: US 10,658,977 B2
(45) Date of Patent: *May 19, 2020

(54) POWER AMPLIFIERS ISOLATED BY DIFFERENTIAL GROUND

(71) Applicant: SKYWORKS SOLUTIONS, INC., Woburn, MA (US)

(72) Inventors: Foad Arfaei Malekzadeh, Ottawa (CA); Stephen Joseph Kovacic, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/244,754

(22) Filed: Jan. 10, 2019

(65) Prior Publication Data

US 2019/0149094 A1 May 16, 2019

Related U.S. Application Data

(63) Continuation of application No. 15/698,488, filed on Sep. 7, 2017, now Pat. No. 10,218,310.

(Continued)

(51) Int. Cl.
*H03F 3/45* (2006.01)
*H03F 1/02* (2006.01)
(Continued)

(52) U.S. Cl.
CPC ........... *H03F 1/0205* (2013.01); *H03F 1/223* (2013.01); *H03F 3/195* (2013.01); *H03F 3/245* (2013.01);
(Continued)

(58) Field of Classification Search
CPC .......................................................... H03F 3/45
(Continued)

(56) References Cited

U.S. PATENT DOCUMENTS 5,389,840 A * 2/1995 Dow ...................... G06G 7/163
327/356
6,188,203 B1 * 2/2001 Rice ........................ F02N 11/04
322/25

(Continued)

OTHER PUBLICATIONS

Al-Shaharani, Saad M. "Differential CMOS Class-E RF Power Amplifer" Proceedings of the 2007 WSEAS Int. Conference on Circuits, Systems, Signal and Telecommunications, Gold Coast, Australia, Jan. 17-19, 2007 (4 pages).

(Continued)

*Primary Examiner* — Henry Choe
(74) *Attorney, Agent, or Firm* — Knobbe, Martens Olson & Bear, LLP

(57) ABSTRACT

Apparatus and methods for power amplifiers isolated by differential ground are provided. In certain implementations, a mobile device includes a transceiver that generates a plurality of radio frequency input signals including a first radio frequency input signal and a second radio frequency input signal, and a plurality of differential power amplifiers including a first differential power amplifier that provides amplification to the first radio frequency input signal and a second differential power amplifier that provides amplification to the second radio frequency input signal. The first differential power amplifier and the second differential power amplifier each operate with differential ground so as to provide isolation between the first differential power amplifier and the second differential power amplifier.

20 Claims, 12 Drawing Sheets

Related U.S. Application Data

(60) Provisional application No. 62/385,258, filed on Sep. 9, 2016.

(51) Int. Cl.
*H03F 1/22* (2006.01)
*H03F 3/195* (2006.01)
*H03F 3/24* (2006.01)
*H03F 3/26* (2006.01)
*H03F 3/68* (2006.01)

(52) U.S. Cl.
CPC ......... *H03F 3/265* (2013.01); *H03F 3/45179* (2013.01); *H03F 3/45188* (2013.01); *H03F 3/68* (2013.01); *H03F 2200/06* (2013.01); *H03F 2200/09* (2013.01); *H03F 2200/186* (2013.01); *H03F 2200/189* (2013.01); *H03F 2200/222* (2013.01); *H03F 2200/387* (2013.01); *H03F 2203/45301* (2013.01)

(58) Field of Classification Search
USPC .................................................. 330/261, 253
See application file for complete search history.

(56) References Cited

U.S. PATENT DOCUMENTS

| | | | | |
|---|---|---|---|---|
| 8,810,314 B2* | 8/2014 | Mulawski | ............ | H03F 1/0222 330/136 |
| 8,816,769 B2* | 8/2014 | Moreira | .................. | H03F 3/45 330/253 |
| 9,041,472 B2* | 5/2015 | Chen | .................. | H01L 24/85 330/307 |
| 10,218,310 B2 | 2/2019 | Arfaei Malekzadeh et al. | | |
| 2005/0206412 A1 | 9/2005 | Moraveji et al. | | |
| 2006/0049874 A1 | 3/2006 | Pan | | |
| 2010/0148871 A1 | 6/2010 | Lee et al. | | |
| 2010/0237941 A1 | 9/2010 | Goldfarb et al. | | |
| 2011/0037518 A1 | 2/2011 | Lee et al. | | |
| 2011/0261734 A1 | 10/2011 | Dupuy et al. | | |
| 2013/0063210 A1* | 3/2013 | Corsi | .................. | H03F 1/223 330/253 |
| 2013/0127010 A1 | 5/2013 | Genik et al. | | |
| 2013/0344838 A1* | 12/2013 | Li | .................. | H03F 1/26 455/311 |
| 2014/0253234 A1 | 9/2014 | Lee et al. | | |
| 2015/0280653 A1 | 10/2015 | Wimpenny | | |
| 2016/0190996 A1* | 6/2016 | Searle | .................. | H03F 1/0277 330/295 |
| 2016/0261235 A1 | 9/2016 | Ortiz | | |
| 2016/0261238 A1 | 9/2016 | Ortiz | | |
| 2016/0261242 A1 | 9/2016 | Ortiz | | |

OTHER PUBLICATIONS

Wang et al., "Design of BiFET Stacked Folded Differential Power Amplifier for TD-LTE" International Core Journal of Engineering vol. 1 No. 5, 2015, ISSN: 2414-1895 (6 pages).

* cited by examiner

MXN DL MIMO

NXM UL MIMO

POWER AMPLIFIERS ISOLATED BY DIFFERENTIAL GROUND

CROSS-REFERENCE TO RELATED APPLICATIONS

This application is a continuation of U.S. application Ser. No. 15/698,488, filed Sep. 7, 2017, and titled "POWER AMPLIFIER SYSTEMS WITH DIFFERENTIAL GROUND," which claims the benefit of priority under 35 U.S.C. § 119 of U.S. Provisional Patent Application No. 62/385,258, filed Sep. 9, 2016 and titled "POWER AMPLIFIERS SUPPORTING MILLIMETER-WAVES," each of which is herein incorporated by reference in its entirety.

BACKGROUND

Field

Embodiments of the invention relate to electronic systems, and in particular, to radio frequency (RF) electronics.

Description of the Related Technology

Power amplifiers can be used to boost or amplify a radio frequency (RF) signal. Thereafter, the boosted RF signal can be used for a variety of purposes, including, for example, driving an antenna of an RF communication system.

Power amplifiers can be included in a wide variety of communication devices, including, but not limited to, mobile phones, tablets, base stations, network access points, laptops, computers, and televisions. Power amplifiers provide amplification to RF signals, which can have a frequency in the range from about 450 MHz to about 90 GHz for certain communication standards.

SUMMARY

In certain embodiments, the present disclosure relates to semiconductor die for a radio frequency communication system. The semiconductor die includes a first differential ground network configured to distribute a ground voltage, a first differential power amplifier including a first half circuit and a second half circuit that operate differentially to provide amplification. The first half circuit and the second half circuit are symmetrically connected to the first differential ground network.

In various embodiments, the semiconductor die further includes a second differential power amplifier, and the first differential ground network is operable to provide isolation between the first differential power amplifier and the second differential power amplifier.

In a number of embodiments, the semiconductor die further includes a digital signal processing circuit configured to control a first radio frequency input signal to the first differential power amplifier and a second radio frequency input signal to the second differential power amplifier, and the digital signal processing circuit is operable to provide at least one of multi-input multi-output encoding or beam forming. In accordance with several embodiments, the semiconductor die further includes a second differential ground network configured to distribute the ground voltage, and the second differential power amplifier includes a first half circuit and a second half circuit symmetrically connected to the second differential ground network.

In some embodiments, the first half circuit and the second half circuit tap the first differential ground network at substantially equidistant positions from a line of symmetry of the first differential ground network.

In accordance with certain embodiments, the semiconductor further includes a plurality of ground pads configured to provide the ground voltage to the first differential ground network. In a number of embodiments, an amount of parasitic of inductance between the first half circuit and the plurality of ground pads is about the same as an amount of parasitic inductance between the second half circuit and the plurality of ground pads.

In various embodiments, the first differential power amplifier further includes at least one of an input balun configured to provide single-ended to differential signal conversion or an output balun configured to provide differential to single-ended signal conversion.

In some embodiments, the first half circuit includes a first cascode field-effect transistor and the second half circuit includes a second cascode field-effect transistor, and the first differential power amplifier further includes a first neutralization capacitor coupled between a gate of the cascode field-effect transistor and a drain of the second cascode field-effect transistor, and a second neutralization capacitor coupled between a gate of the second cascode field-effect transistor and a drain of the first cascode field-effect transistor. In several embodiments, the first differential power amplifier further includes a gate capacitor connected differential between the gate of the first cascode field-effect transistor and the gate of the second cascode field-effect transistor.

In accordance with several embodiments, the first half circuit includes a first plurality of cascode devices and a first plurality of intermetal capacitors formed from a first conductor stack and coupled to the first plurality of cascode transistors, and the second half circuit includes a second plurality of cascode devices and a second plurality of intermetal capacitors formed from a second conductor stack and coupled to the second plurality of cascode transistors.

In certain embodiments, the present disclosure relates to a radio frequency communication system. The radio frequency communication system includes a first differential power amplifier including a first half circuit and a second half circuit configured to provide differential amplification to a first radio frequency input signal. The radio frequency communication system further includes a digital signal processing circuit configured to control the first radio frequency input signal, and a first differential ground network configured to provide distribution of a ground voltage, the first differential ground network having substantially symmetric connections to the first half circuit and the second half circuit.

In a number of embodiments, the radio frequency communication system further includes a second differential power amplifier configured to provide differential amplification to a second radio frequency input signal that is controlled by the digital signal processing circuit, and the first differential ground network is operable to provide isolation between the first differential power amplifier and the second differential power amplifier. In several embodiments, the digital signal processing circuit is operable to provide at least one of multi-input multi-output encoding or beam forming. In a various embodiments, the radio frequency communication system further includes a second differential ground network configured to distribute the ground voltage, and the second differential ground network having substantially symmetric connections to a first half circuit and a second half circuit of the second differential power amplifier.

In certain embodiments, the present disclosure relates to a packaged radio frequency module. The packaged radio frequency module includes a package substrate, and a semiconductor die attached to the package substrate. The semiconductor die includes a first differential ground network configured to distribute a ground voltage, and a first differential power amplifier including a first half circuit and a second half circuit that operate differentially to provide amplification. The first half circuit and the second half circuit are symmetrically connected to the first differential ground network.

In some embodiments, the semiconductor die further includes a second differential power amplifier, and the first differential ground network is operable to provide isolation between the first differential power amplifier and the second differential power amplifier.

In accordance with a number of embodiments, the packaged radio frequency module further includes a second differential ground network configured to distribute the ground voltage, and the second differential power amplifier includes a first half circuit and a second half circuit symmetrically connected to the second differential ground network. In accordance with a number of embodiments, the first half circuit and the second half circuit tap the first differential ground network at substantially equidistant positions from the line of symmetry.

In a number of embodiments, the semiconductor die further includes a plurality of ground pads configured to provide the ground voltage to the first differential ground network, and the first differential power amplifier is connected to the differential ground network such that an amount of parasitic of inductance between the first half circuit and the plurality of ground pads is about the same as an amount of parasitic inductance between the second half circuit and the plurality of ground pads.

In certain embodiments, the present disclosure relates to a mobile device. The mobile device includes a transceiver configured to generate a plurality of radio frequency input signals including a first radio frequency input signal and a second radio frequency input signal. The mobile device further includes a plurality of differential power amplifiers including a first differential power amplifier configured to provide amplification to the first radio frequency input signal and a second differential power amplifier configured to provide amplification to the second radio frequency input signal. The first differential power amplifier and the second differential power amplifier are each configured to operate with differential ground so as to provide isolation between the first differential power amplifier and the second differential power amplifier.

In accordance with a number of embodiments, the transceiver is configured to provide multi-input multi-output encoding to the plurality of radio frequency input signals.

In some embodiments, the transceiver is configured to control the plurality of radio frequency input signals to provide beam forming.

In various embodiments, the plurality of differential power amplifiers includes at least three differential power amplifiers.

In several embodiments, the first radio frequency input signal and the second radio frequency input signal are of different signal types.

In a number of embodiments, the mobile device further includes an antenna array including a first antenna configured to receive a first amplified radio frequency signal from the first differential power amplifier and a second antenna configured to receive a second amplified radio frequency signal from the second differential power amplifier.

According to some embodiments, the mobile device further includes a differential ground network configured to distribute a ground voltage to the first differential power amplifier, and the first differential power amplifier includes a first half circuit and a second half circuit symmetrically connected to the differential ground network and configured to provide differential amplification to the first radio frequency input signal. In various embodiments, the first half circuit and the second half circuit tap the first differential ground network at substantially equidistant positions from a line of symmetry of the differential ground network. In accordance with several embodiments, a transistor layout of the first half circuit and a transistor layout of the second half circuit are symmetrical with respect to the line of symmetry. According to a number of embodiments, the mobile device further includes a plurality of ground pads configured to receive the ground voltage and positioned symmetrically with respect to the line of symmetry. In accordance with several embodiments, an amount of parasitic of inductance between the first half circuit and the plurality of ground pads is about the same as an amount of parasitic inductance between the second half circuit and the plurality of ground pads.

In certain embodiments, the present disclosure relates to a packaged radio frequency module. The radio frequency module includes a package substrate and a power amplifier die attached to the package substrate. The power amplifier die includes a plurality of differential power amplifiers including a first differential power amplifier configured to provide amplification to a first radio frequency input signal and a second differential power amplifier configured to provide amplification to a second radio frequency input signal. The first differential power amplifier and the second differential power amplifier are each configured to operate with differential ground to thereby provide isolation between the first differential power amplifier and the second differential power amplifier.

In various embodiments, the packaged radio frequency module further includes a semiconductor die attached to the package substrate and including a transceiver configured to generate a plurality of radio frequency input signals including the first radio frequency input signal and the second radio frequency input signal. In several embodiments, the transceiver is configured to provide multi-input multi-output encoding to the plurality of radio frequency input signals. In a number of embodiments, the transceiver is configured to control the plurality of radio frequency input signals to provide beam forming.

In several embodiments, the power amplifier die further includes a differential ground network configured to distribute a ground voltage to the first differential power amplifier, and the first differential power amplifier including a first half circuit and a second half circuit are symmetrically connected to the differential ground network and configured to provide differential amplification to the first radio frequency input signal. In various embodiments, the first half circuit and the second half circuit tap the first differential ground network at substantially equidistant positions from a line of symmetry of the differential ground network. In accordance with some embodiments, a transistor layout of the first half circuit and a transistor layout of the second half circuit are symmetrical with respect to the line of symmetry. In a number of embodiments, the power amplifier die further includes a plurality of ground pads configured to receive the ground voltage and positioned symmetrically with respect to the line of symmetry. In accordance with some embodiments, an amount of parasitic of inductance between the first half circuit and the plurality of ground pads is about the same as an amount of parasitic inductance between the second half circuit and the plurality of ground pads.

In certain embodiments the present disclosure relates to a radio frequency communication device. The radio frequency communication device includes a plurality of modulators configured to generate a plurality of radio frequency input signals including a first radio frequency input signal and a second radio frequency input signal. The radio frequency communication device further includes a plurality of differential power amplifiers including a first differential power amplifier configured to provide amplification to the first radio frequency input signal and a second differential power amplifier configured to provide amplification to the second radio frequency input signal. The first differential power amplifier and the second differential power amplifier are each configured to operate with differential ground so as to provide isolation between the first differential power amplifier and the second differential power amplifier.

In some embodiments, the radio frequency communication device further includes a digital signal processing circuit configured to provide the plurality of modulators with a plurality of in-phase digital signals and a plurality of quadrature-phase digital signals. In a number of embodiments, the digital signal processing circuit is configured to control multi-input multi-output encoding of the plurality of radio frequency input signals. In several embodiments, the digital signal processing circuit is configured to control beam forming of the plurality of radio frequency input signals.

DETAILED DESCRIPTION OF EMBODIMENTS

Figure 1:
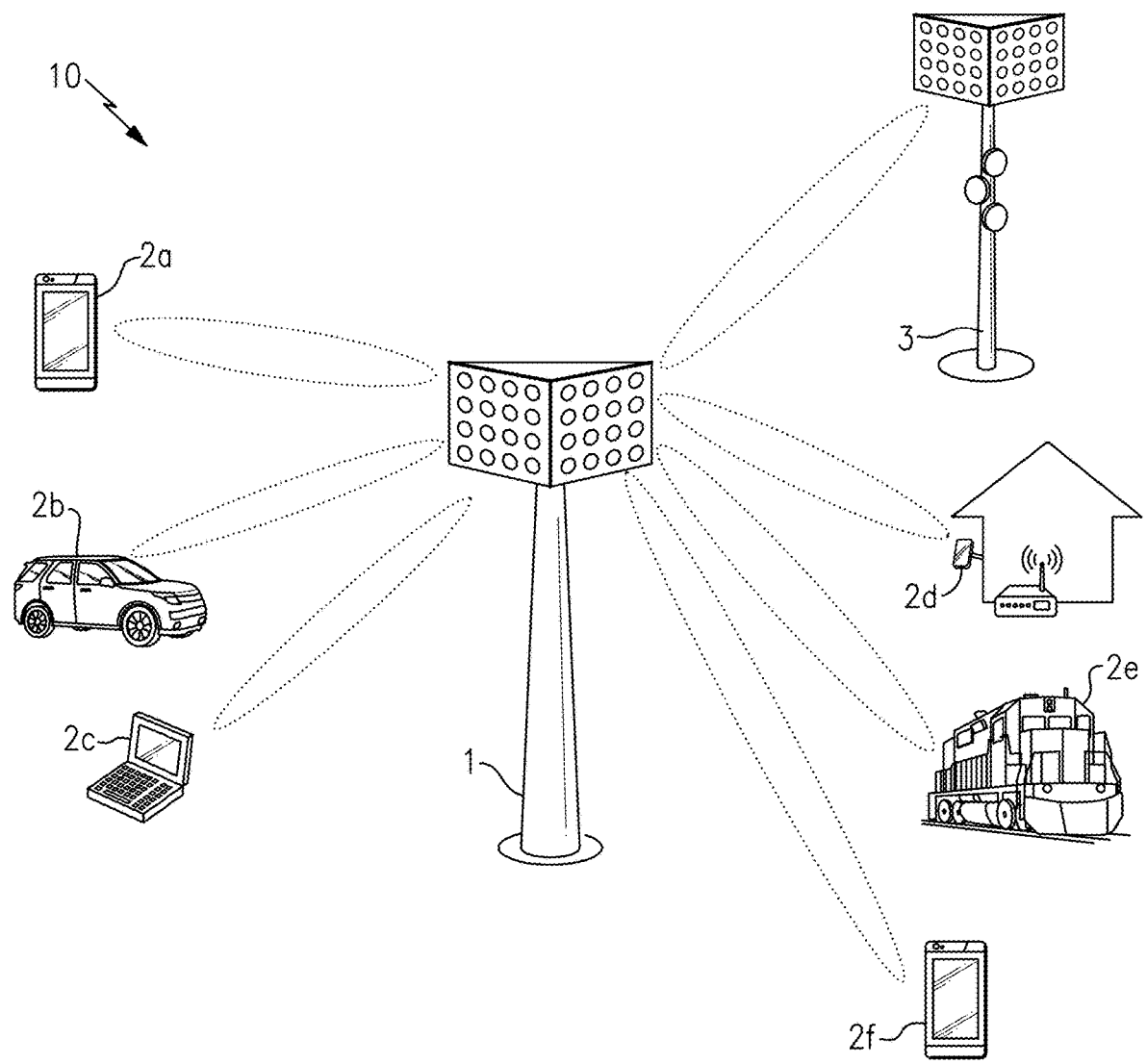
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Affiance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP plans to introduce Phase 1 of fifth generation (5G) technology in Release 15 (targeted for 2018) and Phase 2 of 5G technology in Release 16 (targeted for 2019). Release 15 is anticipated to address 5G communications at less than 6 GHz, while Release 16 is anticipated to address communications at 6 GHz and higher. Subsequent 3GPP releases will further evolve and expand 5G technology. 5G technology is also referred to herein as 5G New Radio (NR).

Preliminary specifications for 5G NR support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, and a second mobile device 2f.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices.

The illustrated communication network 10 of FIG. 1 supports communications using a variety of technologies, including, for example, 4G LTE, 5G NR, and wireless local area network (WLAN), such as Wi-Fi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. In one embodiment, one or more of the mobile devices support a HPUE power class specification.

In certain implementations, a base station and/or user equipment communicates using beam forming. For example, beam forming can be used to focus signal strength to overcome path losses, such as high loss associated with communicating over high signal frequencies. In certain embodiments, user equipment, such as one or more mobile phones, communicate using beam forming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDM is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beam forming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
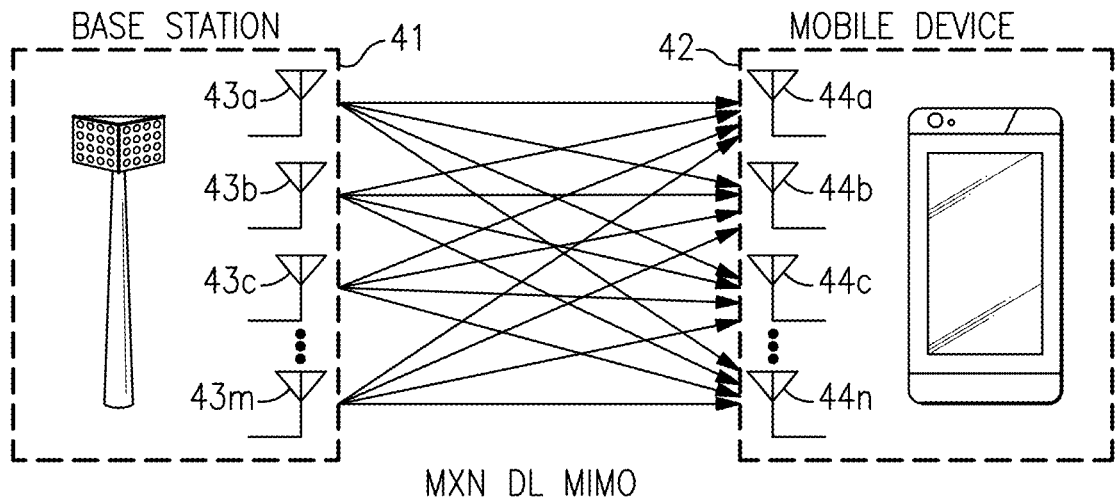
FIG. 2A is a schematic diagram of one example of a downlink channel using multi-input and multi-output (MIMO) communications.
Figure 2B:
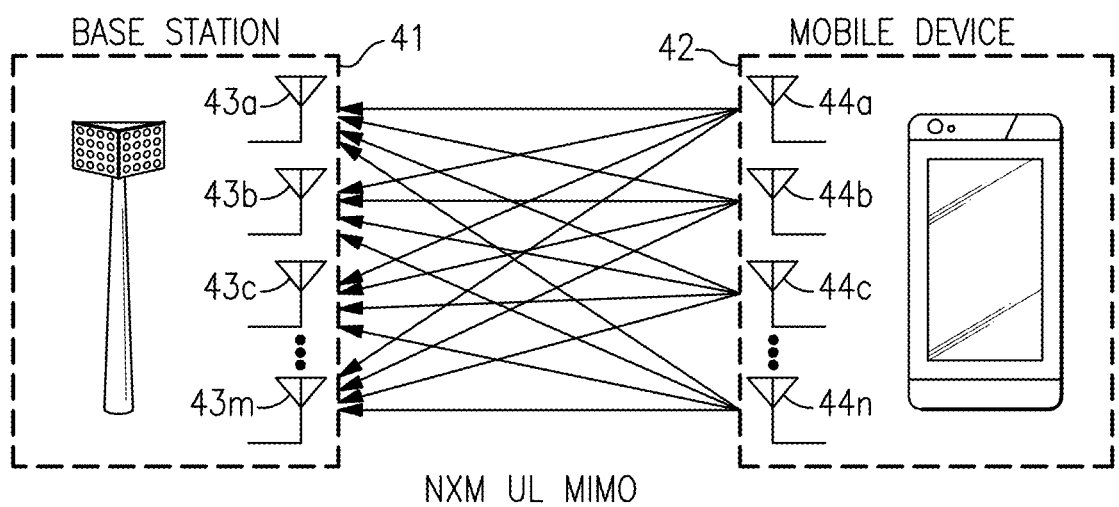
FIG. 2B is schematic diagram of one example of an uplink channel using MIMO communications.

FIG. 2A is a schematic diagram of one example of a downlink channel using multi-input and multi-output (MIMO) communications. FIG. 2B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 2A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 2A illustrates an example of M×N DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 2B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 2B illustrates an example of N×M UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3:
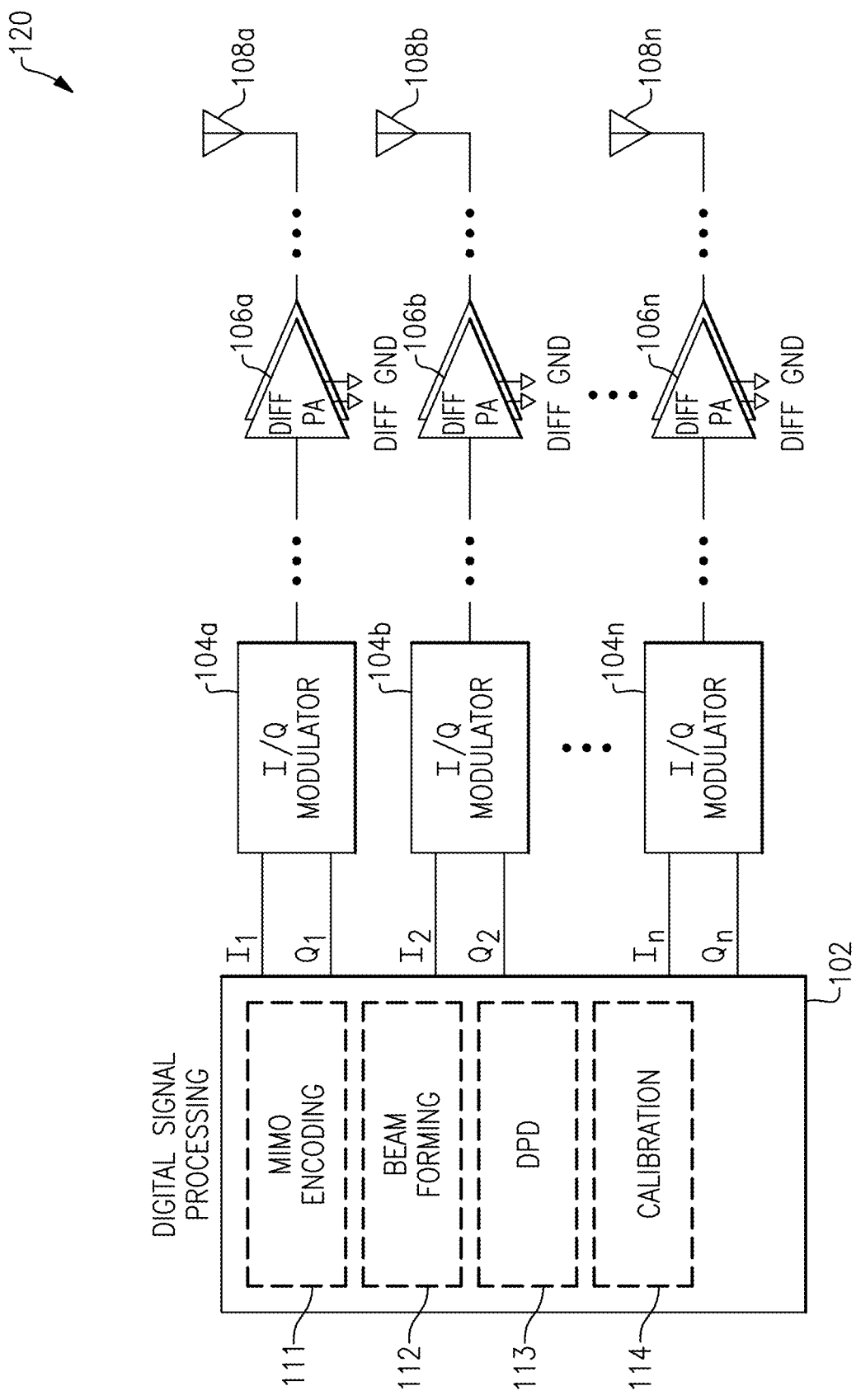
FIG. 3 is a schematic diagram of one embodiment of a communication system for transmitting radio frequency (RF) signals.

FIG. 3 is a schematic diagram of one embodiment of a communication system 120 for transmitting RF signals. The communication system 120 includes a digital signal processing circuit 102, I/Q modulators 104a, 104b . . . 104n, differential power amplifiers 106a, 106b . . . 106n, and antennas 108a, 108b . . . 108n.

In the illustrated embodiment, the communication system 120 includes three transmit signal paths, each of which includes an I/Q modulator, a differential power amplifier, and an antenna. Although three transmit signal paths are shown, the communication system 120 can include more or fewer transmit signal paths as indicated by the ellipses.

Thus, the communication system 120 can be implemented with any suitable number of I/Q modulators, differential power amplifiers, and/or antennas. Furthermore, although certain components of the transmit signal path are shown, additional components can be included in one or more of the transmit signal paths. Examples of circuits and components that can be included in a transmit signal path include, but are not limited to, filters, resonators, attenuators, amplifiers, phase shifters, duplexers, diplexers, triplexers, detectors, directional couplers, and/or switches.

As shown in FIG. 3, the digital signal processing circuit 102 provides a pair of I and Q signals to each of the I/Q modulators 104a, 104b . . . 104n. Each pair of I and Q signals can be used to represent a sinusoidal wave or signal of desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals are provided to the I/Q modulators in a digital format.

Each of the I/Q modulators 104a, 104b . . . 104n receives a pair of I and Q signals from the digital signal processing circuit 102 and processes the I and Q signals to generate an RF signal. For example, each I/Q modulator can include digital-to-analog converters (DACs) configured to convert the I and Q signals into an analog format, mixers for upconverting the I and Q signals to radio frequency, and a signal combiner for combining the upconverted I and Q signals into an RF signal suitable for amplification by a differential power amplifier. In certain implementations, the I/Q modulator can include one or more filters configured to filter frequency content of signals processed therein.

In the illustrated embodiment, the communication system 120 includes differential power amplifiers 106a, 106b . . . 106n each operating with differential ground. As will be described in detail herein, operating a differential power amplifier with differential ground provides a number of advantages, including higher immunity to noise of a ground supply of the semiconductor chip on which the differential power amplifiers 106a, 106b . . . 106n are fabricated. Thus, robust isolation is provided even when multiple transmit signal paths or chains of a single die are operating and active. Accordingly, using differential ground enables the power amplifiers to operate with higher isolation from other circuit activity of the chip, including, but not limited to, the activity of other power amplifiers.

The differential power amplifiers herein can be used to amplify a wide range of frequencies, including relatively high radio frequencies of 6 GHz or more, for instance, millimeter wave frequencies in the range of about 30 GHz to about 300 GHz.

The antennas 108a, 108b . . . 108n can correspond to antennas implemented in a wide variety of ways. Examples of suitable antenna types include, but are not limited to, patch antennas, dipole antennas, ceramic resonators, stamped metal antennas, and/or laser direct structuring antennas. In certain implementations, the antennas 108a, 108b . . . 108n are arranged in an array, for instance, to provide beam forming.

The digital signal processing circuit 102 can be any suitable processing circuitry suitable for providing digital processing baseband signals and/or other signals for transmission. For instance, the digital signal processing circuit 102 can include a digital signal processor, a microprocessor, a programmable core, or any combination thereof.

In the illustrated embodiment, the digital signal processing circuit 102 includes a MIMO encoding circuit 111, a beam forming circuit 112, a digital pre-distortion (DPD) circuit 113, and a calibration circuit 114.

The MIMO encoding circuit 111 aids in providing symbol mapping to enhance the performance of MIMO communications of the communication system 120. Examples of encoding and/or pre-encoding that can be provided by the MIMO encoding circuit 111 include, but are not limited to, spatial multiplexing coding, space-time coding, and/or spatial modulation.

With continuing reference to FIG. 3, the beam forming circuit 112 operates to generate the I and Q signals to provide beam forming. For example, beam forming can be used to focus signal strength to overcome path losses, such as high loss associated with communicating over high signal frequencies. In certain embodiments, the communication system 120 operates using beam forming on millimeter wave frequency bands in the range of 30 GHz to 300 GHz and/or upper centimeter wave frequencies in the range of 6 GHz to 30 GHz, or more particularly, 24 GHz to 30 GHz.

The DPD circuit 113 provides digital pre-distortion to digitally shape the signals generated by the digital signal processing circuit 102. DPD can be used to reduce a distortion of and/or increase the efficiency of the differential power amplifiers 106a, 106b . . . 106n. Although not illustrated in FIG. 3, the communication system 120 can include circuitry for sensing an output power of one or more of the differential power amplifiers 106a, 106b . . . 106n. For example, directional couplers can be included at the output of the differential power amplifiers 106a, 106b . . . 106n to aid in providing power detection for DPD, power control, and/or other purposes.

The calibration circuit 114 can provide a wide range of calibration techniques to compensate for impairments of the communication system 120. Examples of impairments that can be compensated for using the calibration circuit 114 include, but are not limited to phase noise, frequency error, signal compression, I/Q imbalance (for instance, gain and/or phase mismatch), local oscillator leakage, signal non-linearity, and/or spurious components.

Figure 4A:
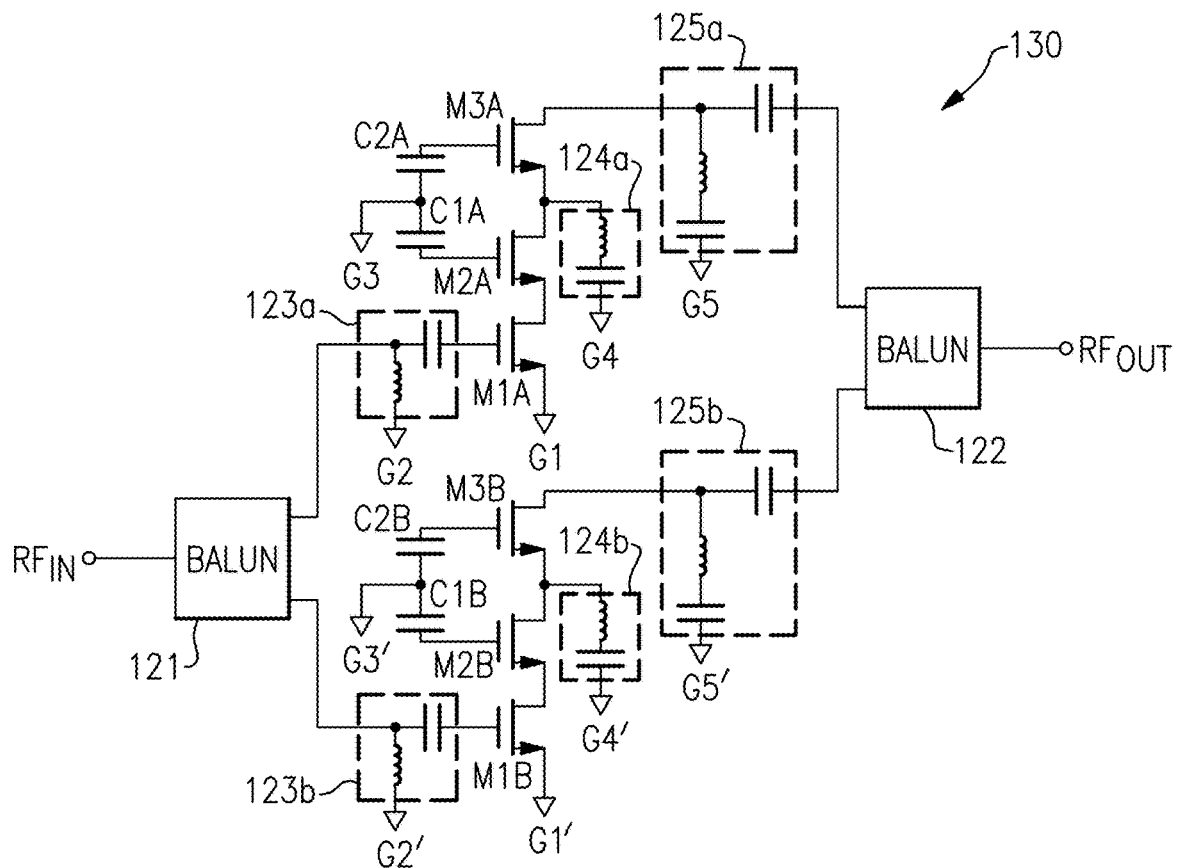
FIG. 4A is a schematic diagram of one embodiment of a differential power amplifier with differential ground.
Figure 4B:
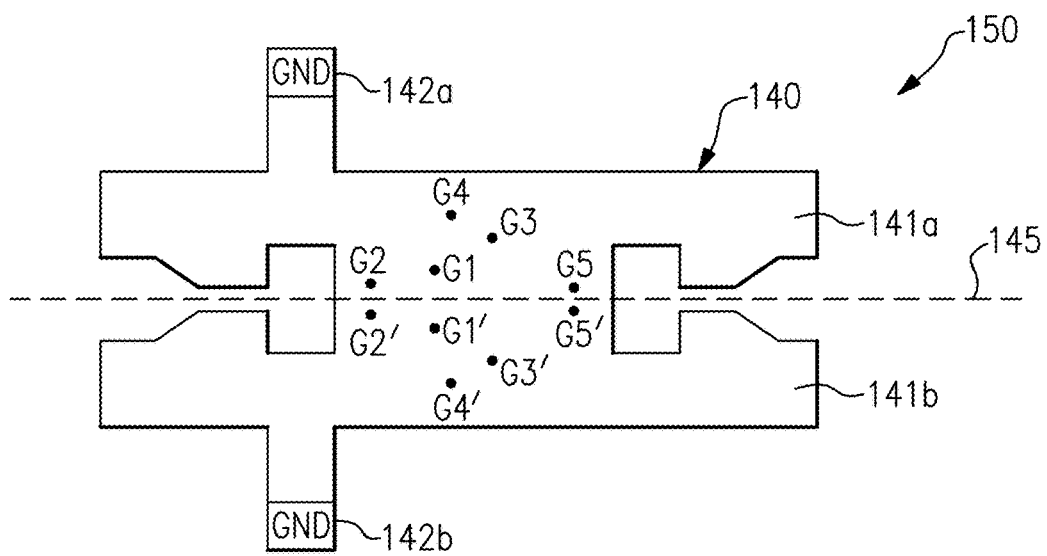
FIG. 4B is a schematic plan view of one embodiment of a differential ground network for the differential power amplifier of FIG. 4A.

FIG. 4A is a schematic diagram of one embodiment of a differential power amplifier 130 with differential ground. FIG. 4B is a schematic plan view of one embodiment of a differential ground network 150 for the differential power amplifier 130 of FIG. 4A.

The differential power amplifier 130 of FIG. 4A includes an input balun 121 that converts an input signal $RF_{IN}$ into a differential input signal including a first or non-inverted signal component and a second or inverted signal component. The first signal component is processed using a first half circuit of the differential power amplifier 130, and the second signal component is processed using a second half circuit of the differential power amplifier 130. The output signal balun 122 converts the processed signal components from the first and second half circuits into a single-ended output signal $RF_{OUT}$.

In the illustrated embodiment, the first half circuit of the differential power amplifier 130 includes a first input matching circuit 123a, a first gain field-effect transistor (FET) M1A, a first group of cascode FETs (M2A, M3A), a first group of gate capacitors (C1A, C2A), a first harmonic termination circuit 124a and a first output matching circuit 125a. Additionally, the second half circuit of the differential power amplifier 130 includes a second input matching circuit 123b, a second gain FET M1B, a second group of cascode FETs (M2B, M3B), a second group of gate capacitors (C1B, C2B), a second harmonic termination circuit 124b, and a second output matching circuit 125b.

The differential ground network 150 includes a first ground pin or pad 142a, a second ground pad 142b, and a ground distribution conductor 140. Although an embodiment with two ground pads is shown, other numbers of ground pads can be used. The ground distribution conductor 140 corresponds to a conductor formed on one or more conductive layers of a semiconductor chip to distribute ground from ground pads to the differential power amplifier. For clarity of the figures, vias are not shown. Although one example of a shape or pattern of a ground distribution conductor is shown, the teachings herein are applicable to ground distribution conductors implemented in a wide variety of ways. Accordingly, other implementations are possible.

The ground distribution conductor 140 has reflection symmetry with respect to a line of symmetry 145. Thus, the line of symmetry 145 serves to divide the differential ground conductor 140 into a first portion 141a and a second portion 141b that are substantially mirror symmetric with respect to one another.

As shown in FIGS. 4A and 4B, the differential power amplifier 130 is connected to the differential ground network 150 such that the first half circuit and the second half circuit connect to the ground distribution conductor 140 at symmetric positions with respect to the line of symmetry 145. Thus, the first half circuit and the second half circuit of the differential power amplifier 160 are symmetrically connected to the differential ground network 150.

For example, a source of the first gain FET M1A and a source of the second gain FET M1B connect to points G1 and G1', respectively, of the ground distribution conductor 140. Additionally, the first input matching circuit 123a and the second input matching circuit 123b connect to points G2 and G2', respectively. Furthermore, the first group of gate capacitors (C1A, C2A) and the second group of gate capacitors (C1B, C2B) connect to points G3 and G3', respectively. Additionally, the first harmonic termination circuit 124a and the second harmonic termination circuit 124b connect to points G4 and G4', respectively. Furthermore, the first output matching circuit 125a and the second output matching circuit 125b connect to points G5 and G5', respectively.

By connecting the half circuits of a differential power amplifier to symmetrical points of a differential ground network, an amount of parasitic inductance present between ground pads and the half circuits is substantially matched. In contrast, a power amplifier that operates without differential ground can exhibit degraded performance arising from inductive effects of conductors used for distributing ground.

For example, to distribute ground to a power amplifier, metal conductors can be used to connect one or more ground pads to nodes of the power amplifier circuit desired to operate at ground potential. However, parasitic inductance of the metal conductors can give rise to impedance drops that result in the nodes of the power amplifier deviating in voltage from the ground potential present at the pads. Such inductive effects are exacerbated when the RF circuit operates with relatively high frequency, for instance, in 5G communication systems operating at 6 GHz or higher and/or in millimeter wave systems. Moreover, such inductive effects can lead to degradation of linearity and/or gain and/or may result in the power amplifier being susceptible to unintended oscillation.

In contrast, the differential power amplifier 130 includes half circuits that symmetrically connect to the differential ground network 150. Since the differential ground network 150 is substantially mirror symmetric with respect to the line of symmetry 145, portions of the ground distribution conductor 140 along the line of symmetry 145 operate with a virtual ground electrical potential. Additionally, points of the ground distribution conductor 140 that about equidistance from the line of symmetry 145 (referred to herein as corresponding points) have about the same amount of parasitic inductance to ground pads. Thus, when half circuits are connected to or tap from corresponding points of the ground distribution conductor 140, the impact of parasitic inductive effects of the ground distribution conductor 140 are reduced or eliminated.

Moreover, multiple differential power amplifiers each implemented with differential ground can be fabricated on-chip. The differential ground networks of the differential power amplifiers can be electrically connected to one another on-chip and/or at the pin level. By implementing differential power amplifiers with differential ground, higher immunity to noise of a ground supply is provided. For example, the half circuits of each differential power amplifier are connected symmetrically to a differential ground network, and thus the amount of parasitic inductance is about the same for each half circuit. Accordingly, electromagnetic interference and/or noise on the chip ground impacts each half circuit substantially equally.

Thus, robust isolation is provided even when multiple transmit signal paths or chains of a single die are operating and active. This isolation is provided even when the differential power amplifiers amplify signals of different amplitude, phase, and/or signal type (including, but not limited to, signals of different types of modulation). Accordingly, using differential ground enables the power amplifiers to operate with higher isolation from other circuit activity of the chip, including, but not limited to, the activity of other power amplifiers.

Although FIG. 4A illustrates one embodiment of a differential power amplifier operating with differential ground, the teachings herein are applicable to differential power amplifiers implemented in a wide variety of ways. For example, the half circuits of a differential power amplifier can include different implementations of input matching, output matching, harmonic termination, biasing, and/or amplification. Furthermore, although the illustrated differential power amplifier is illustrated as a single stage, the teachings herein are also applicable to multi-stage configurations including two or more stages. In such implementations, each stage can be differential and/or a combination of single-ended and differential stages can be used.

In the illustrated embodiment, the input balun 121 provides single-ended to differential conversion, and the output balun 122 provides differential to single-ended conversion. Accordingly, an input balun, an output balun, and/or other suitable convertible circuitry can be used to include a differential power amplifier in an RF system that operates with single-ended signaling. However, the teachings herein are also applicable to implementations in which the input balun 121 and/or output balun 122 are omitted. In one example, the input balun 121 is omitted when the RF input signal to a differential power amplifier is differential, such as implementation in which an RF driver stage includes a differential signal output. In another example, the output balun 122 is omitted, such as in implementations in which the output of the differential power amplifier connects to a differential switch and/or a differential antenna.

The differential ground network 150 of FIG. 4B includes a distribution of ground pads that is substantially symmetrical with respect to the line of symmetry 145. Implementing a differential ground network in this manner aids in balancing an amount of parasitic inductance present between ground and the differential power amplifier's half circuits.

In one embodiment, layouts of transistors and/or passive elements of a differential power amplifier are also substantially symmetric with respect to a line of symmetry of a differential ground network. By implementing the power amplifier layout symmetrically, enhanced device matching and/or superior inductive balancing can be achieved.

The differential power amplifier 130 provides high gain relative to a single-ended power amplifier. For example, parasitic inductance present between a source of a gain FET of a single-ended power amplifier and a ground pad operates to provide source degeneration that degrades gain. In contrast, the differential power amplifier 130 is differentially connected to ground to thereby provide a local virtual ground that reduces or eliminates the impact of degeneration arising from parasitic inductances. Thus, connecting a differential power amplifier to differential ground not only provides enhanced isolation, but also alleviates the impact of inductive degeneration that would otherwise reduce gain.

Figure 5A:
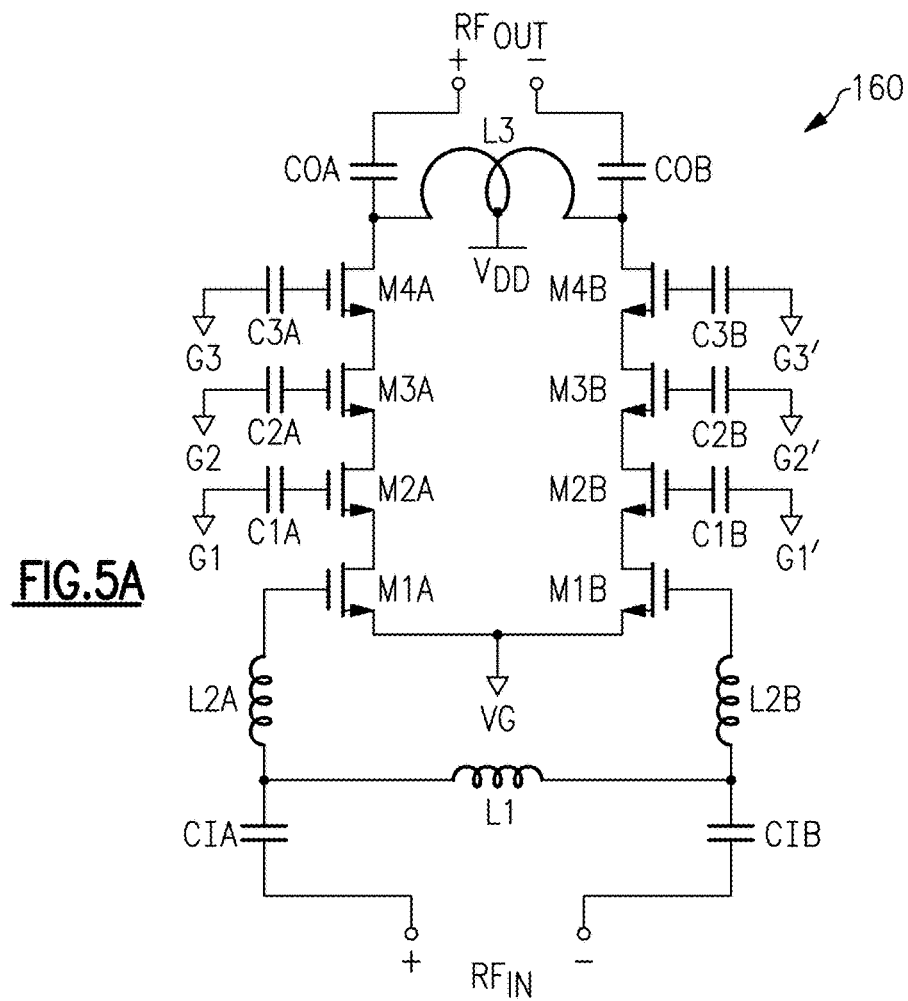
FIG. 5A is a schematic diagram of another embodiment of a differential power amplifier with differential ground.
Figure 5B:
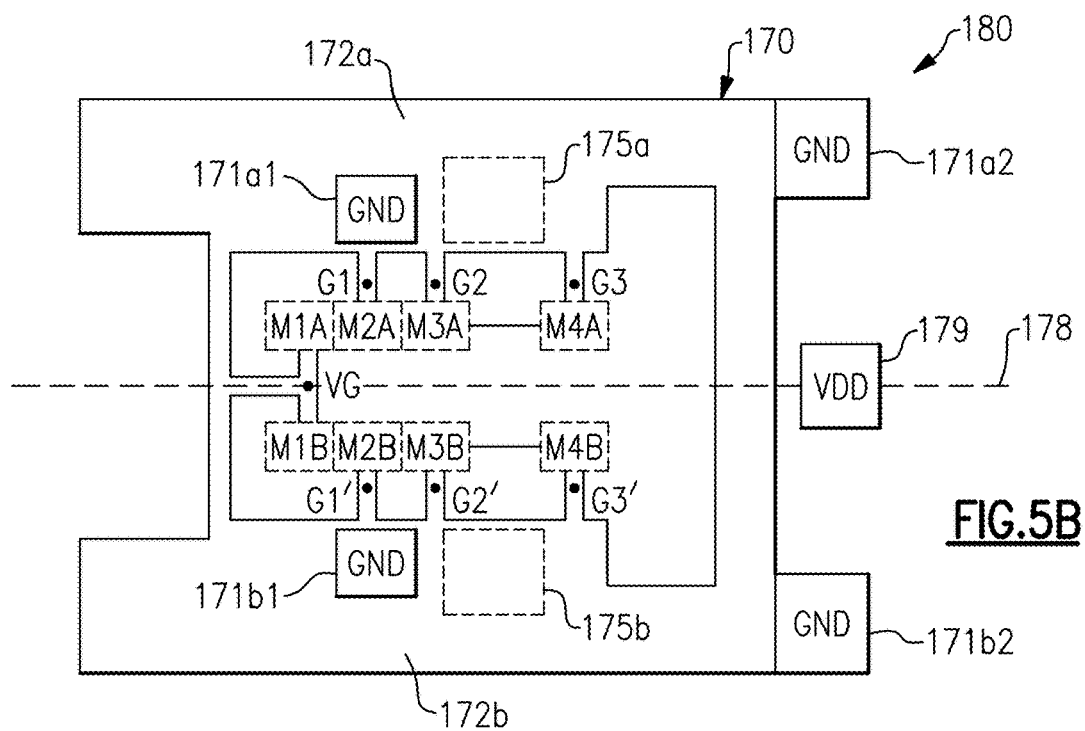
FIG. 5B is a schematic plan view of one embodiment of a differential ground network for the differential power amplifier of FIG. 5A.

FIG. 5A is a schematic diagram of another embodiment of a differential power amplifier 160 with differential ground. FIG. 5B is a schematic plan view of one embodiment of a differential ground network 180 for the differential power amplifier 160 of FIG. 5A.

The differential power amplifier 160 of FIG. 5A receives a differential input signal $RF_{IN}$ including a first or non-inverted signal component and a second or inverted signal component. The first signal component is processed using a first half circuit of the differential power amplifier 160, and the second signal component is processed using a second half circuit of the differential power amplifier 160. The differential power amplifier 160 of FIG. 5A provides a differential output signal $RF_{OUT}$ including a first signal component from the first half circuit and a second signal component from the second half circuit.

In the illustrated embodiment, the first half circuit of the differential power amplifier 160 includes a first input capacitor CIA, a first input inductor L2A, a first gain FET M1A, a first group of cascode FETs (M2A, M3A, M4A), a first group of gate capacitors (C1A, C2A, C3A), and a first output capacitor COA. Additionally, the second half circuit of the differential power amplifier 160 includes a second input capacitor CIB, a second input inductor L2B, a second gain FET M1B, a second group of cascode FETs (M2B, M3B, M4B), a second group of gate capacitors (C1B, C2B, C3B), and a second output capacitor COB. Furthermore, an input inductor L1 is connected differentially across the input capacitors CIA and CIB, and an output inductor L3 is connected differentially across the output capacitors COA and COB. The output inductor L3 includes a center tap that receives a supply voltage VDD for supplying power to the differential power amplifier 160.

The differential ground network 180 includes a ground distribution conductor 170 and ground pads 171a1, 171a2, 171b1, and 171b2. The location of intermetal capacitors 175a, 175b, and a power supply pad 179 have also been shown in FIG. 5B. Furthermore, a boundary of transistor layouts for the FETs M1A, M1B, M2A, M2B, M3A, M3B, M4A, and M4B have been depicted.

Although FIG. 5A illustrates one embodiment of a differential power amplifier operating with differential ground, the teachings herein are applicable to differential power amplifiers implemented in a wide variety of ways. For example, the half circuits of a differential power amplifier can include different implementations of input matching, output matching, harmonic termination, and/or amplification. Furthermore, although the illustrated differential power amplifier is illustrated as a single stage, the teachings herein are also applicable to multi-stage configurations including two or more stages. In such implementations, each stage can be differential and/or a combination of single-ended and differential stages can be used.

The ground distribution conductor 180 has reflection symmetrical with respect to a line of symmetry 178. Thus, the line of symmetry 178 serves to divide the differential ground conductor 170 into a first portion 172a and a second portion 172b that are substantially mirror symmetric to one another.

Although one embodiment of a differential ground network 180 is illustrated, a differential ground network can be implemented in a wide variety of ways. For example, a differential ground network can include a ground distribution conductor of other shapes, tap points in other locations, and/or ground pads of other numbers and/or placements. Indeed, the teachings herein are applicable to differential power amplifiers including differential ground networks implemented in a wide variety of ways.

As shown in FIGS. 5A and 5B, the differential power amplifier 160 is connected to the differential ground network 180 such that the first half circuit and the second half circuit connect to the ground distribution conductor 170 at symmetric positions with respect to the line of symmetry 178. Thus, the half circuits of the differential power amplifier 160 include ground taps that are symmetrical.

For example, a source of the first gain FET M1A and a source of the second gain FET M1B connect to a common point VG of the ground distribution conductor 170. Additionally, the gate capacitor C1A and the gate capacitor C1B connect to points G1 and G1', respectively. Furthermore, the gate capacitor C2A and the gate capacitor C2B connect to points G2 and G2', respectively. Additionally, the gate capacitor C3A and the gate capacitor C3B connect to points G3 and G3', respectively.

By connecting the half circuits of a differential power amplifier symmetrically with respect to a differential ground network, an amount of parasitic inductance present between ground pads and the half circuits is substantially matched. In contrast, a power amplifier that operates without differential ground can exhibit degraded performance arising from inductive effects of conductors used for distributing ground.

Thus, the differential power amplifier 160 includes half circuits that connect to symmetrical points of the differential ground network 180. Since the differential ground network 180 is substantially mirror symmetric with respect to the line of symmetry 178, portions of the ground distribution conductor 170 along the line of symmetry 178 operate with a virtual ground electrical potential. The point VG at which the sources of the gain FETs M1A and M1B connect is an example of one such point. Additionally, a pair corresponding points of the ground distribution conductor 170 that are about equidistance from the line of symmetry 178 have about the same electrical potential and amount of parasitic inductance associated with the ground distribution conductor 170. Thus, when half circuits are connected to or tap from corresponding points of the ground distribution conductor 170, the impact of parasitic inductive effects of the ground distribution conductor 170 are reduced or eliminated.

Moreover, multiple differential power amplifiers each implemented with differential ground can be fabricated on-chip. The differential ground networks of the differential power amplifiers can be electrically connected to one another on-chip and/or at the pin level. By implementing differential power amplifiers with differential ground, higher immunity to noise of a ground supply is provided. For example, the half circuits of each differential power amplifier are connected to symmetrical points of a differential ground network, and thus noise rejection and enhanced isolation are provided. Thus, robust isolation is provided even when multiple transmit signal paths or chains of a single die are operating and active.

With reference to FIG. 5B, the intermetal capacitors 175a corresponds to one implementation of the gate capacitors C1A, C2A, and C3A associated with the first half circuit of the differential power amplifier 160. Additionally, the intermetal capacitors 175b corresponds to one implementation of the gate capacitors C1B, C2B, and C3B associated with the second half circuit of the differential power amplifier 160. One embodiment of the intermetal capacitors 175a and 175b will be described below with reference to FIGS. 6A and 6B. For example, each of the intermetal capacitors 175a and 175b can be implemented using the configuration of intermetal capacitors depicted in FIGS. 6A and 6B.

As shown in FIG. 5B, the layout of the FET M4A is spaced apart from the layouts of the FETs M1A, M2A, and M3A. Likewise, the layout of the FET M4B is spaced apart from the layouts of the FETs M1B, M2B, and M3B. Implementing the transistor layouts in this manner can enhance power amplifier stability. For example, a relatively wide distance between M1A and M4A (and likewise between M1B and M4B) along with a relatively close distance between M1A and M3A (and likewise between M1B and M3B) can provide enhanced robustness against unintended oscillation.

Figure 5C:
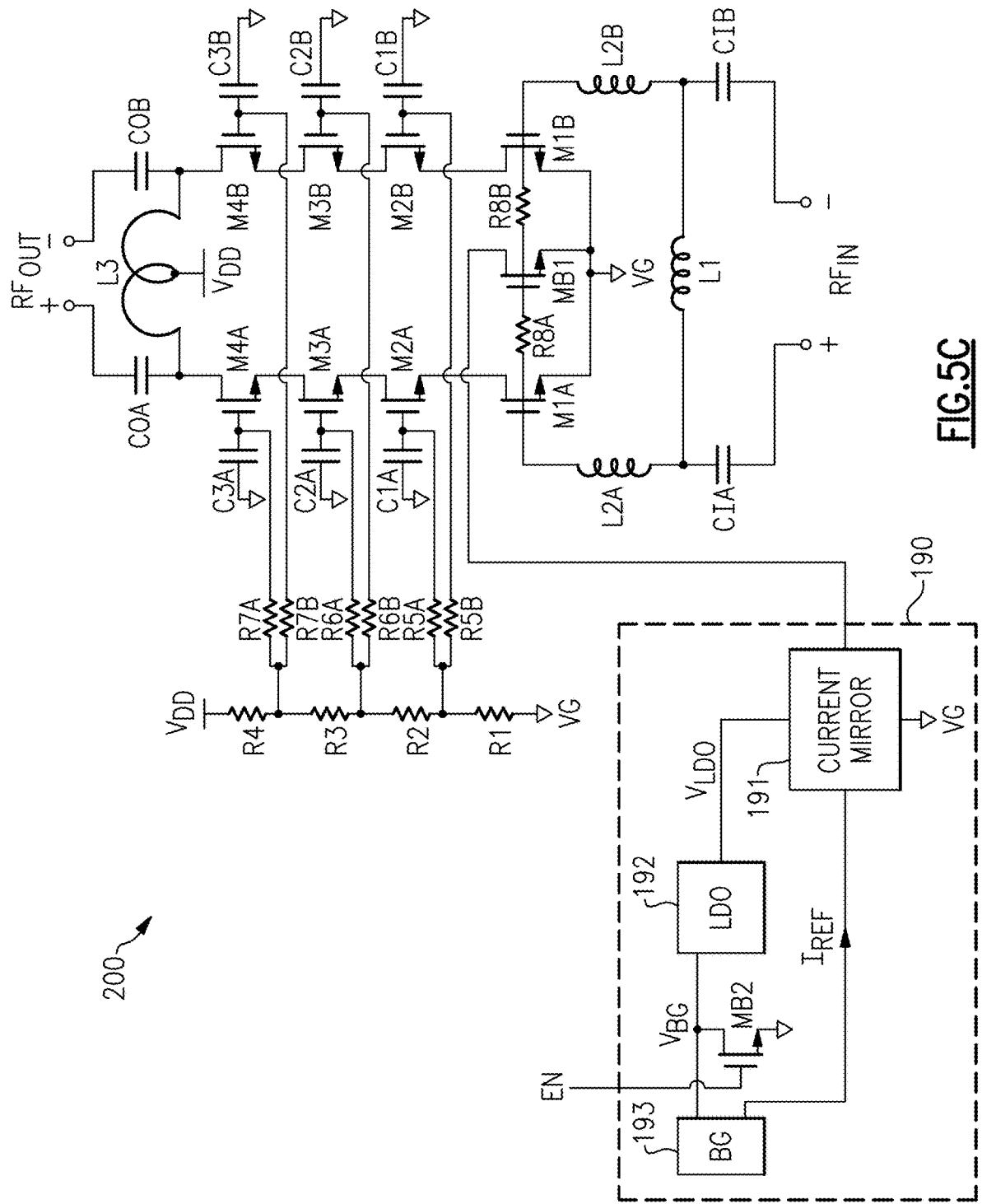
FIG. 5C is a schematic diagram of another embodiment of a differential power amplifier with differential ground.

FIG. 5C is a schematic diagram of another embodiment of a differential power amplifier 200 with differential ground. The differential power amplifier 200 of FIG. 5C is similar to the differential power amplifier 160 of FIG. 5A, except that the differential power amplifier 200 further illustrates one embodiment of bias circuitry for providing biasing.

For example, the bias circuitry of FIG. 5C includes resistors R1, R2, R3, and R4, which are implemented as a voltage divider between a power supply voltage VDD and a virtual ground node of a differential ground network. Additionally, the bias circuitry further includes resistors R5A and R5B that provide a first gate bias voltage from the resistor divider to the gates of the cascode FETs M2A and M2B, respectively. Furthermore, the bias circuitry further includes resistors R6A and R6B that provide a second gate bias voltage from the resistor divider to the gates of the cascode FETs M3A and M3B, respectively. Additionally, the bias circuitry further includes resistors R7A and R7B that provide a third gate bias voltage from the resistor divider to the gates of the cascode FETs M4A and M4B, respectively. The bias circuitry of FIG. 5C further includes a bias FET MB1 and resistors R8A and R8B that provide a gate bias voltage of the bias FET MB1 to the gates of the gain FETs M1A and M1B, respectively.

With continuing reference to FIG. 5C, the bias circuitry of FIG. 5C further includes a bias circuit 190. The bias circuit 190 includes a current mirror 191, a low dropout (LDO) regulator 192, an enable FET MB2, and a bandgap circuit 193. As shown in FIG. 5C, the bias circuit 190 receives an enable signal EN, which is used to control a gate of the enable FET MB2, in this example. The enable signal EN is controllable to selectively pull-down the output of the bandgap circuit 193, thereby turning on or off the differential power amplifier 200. Although FIG. 5C illustrates one example of a bias circuit for a differential power amplifier, a wide variety of bias circuits can be used.

The bandgap circuit 193 generates a bandgap voltage $V_{BG}$, which is provided to the LDO regulator 192 when the bias circuit 190 is enabled. The bandgap circuit 193 also provides a reference current $I_{REF}$ to the current mirror 191. Although FIG. 5C illustrates an implementation with a bandgap circuit, other configurations are possible, such as implementations in which the bandgap circuit 193 is omitted in favor of using a proportional to absolute temperature (PTAT) circuit.

The LDO regulator 192 uses the bandgap voltage $V_{BG}$ to generate a regulated voltage $V_{LDO}$, which is provided to the current mirror 191. The current mirror 191 uses the reference current $I_{REF}$ to control a flow of current through a drain of the bias FET MB1. The current flowing through the bias FET MB1 establishes a gate voltage of the bias FET MB1, which in turn is used bias the gates of gain FETs M1A and M1B.

Figure 6A:
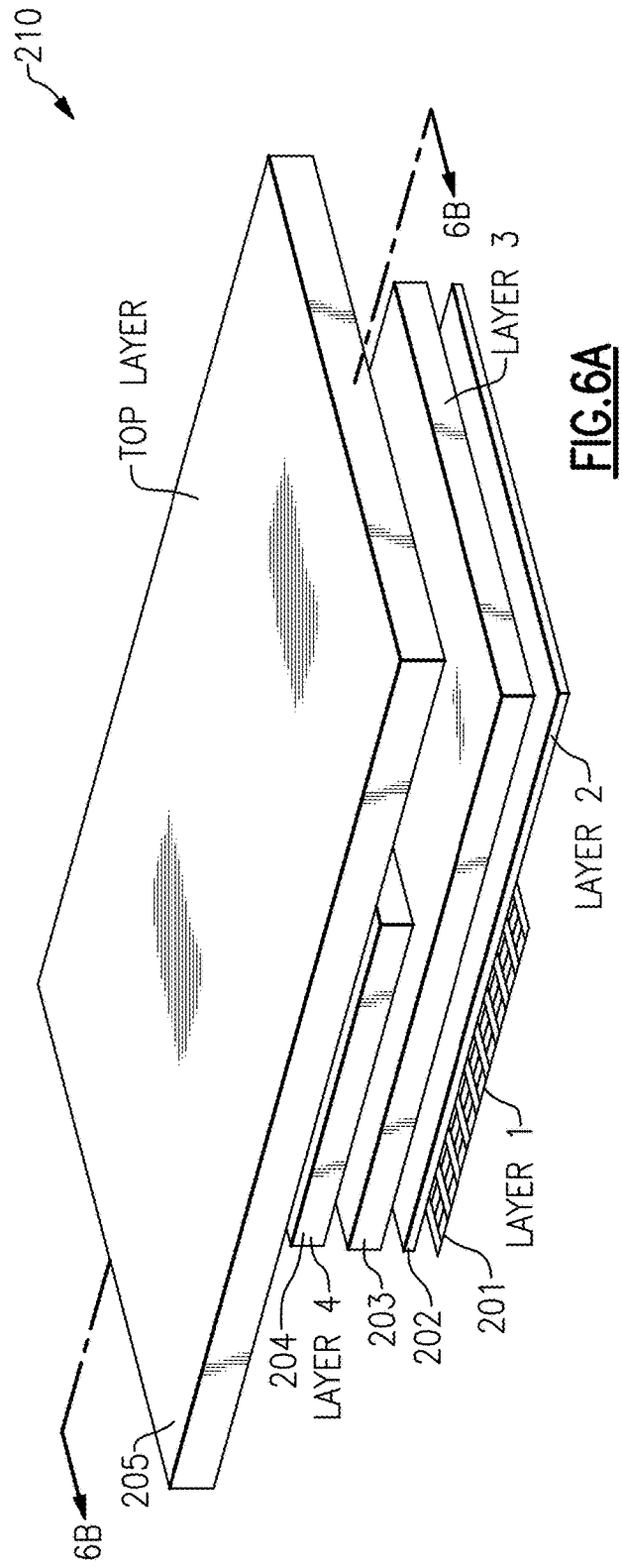
FIG. 6A is a schematic perspective view of one embodiment of intermetal capacitors for a differential power amplifier.
Figure 6B:
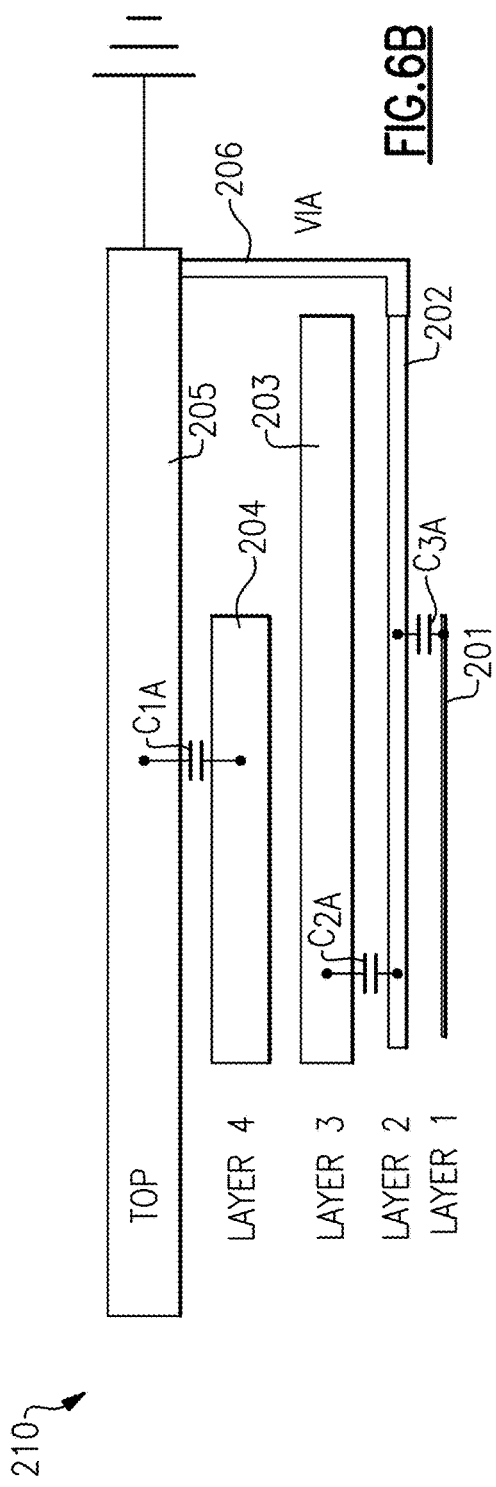
FIG. 6B is an annotated cross section of the intermetal capacitors of FIG. 6A taken along the lines 6B-6B.

FIG. 6A is a schematic perspective view of one embodiment of intermetal capacitors 210 for a differential power amplifier. FIG. 6B is an annotated cross section of the intermetal capacitors 210 of FIG. 6A taken along the lines 6B-6B.

The intermetal capacitors 210 includes a stack of metal conductors including a first metal conductor 201, a second metal conductor 202, a third metal conductor 203, a fourth metal conductor 204, and a fifth metal conductor 205. The metal conductors 201-205 are formed on different conductive layers of a semiconductor die on which the differential power amplifier is fabricated. For clarity of the figures, devices and other components of the differential power amplifier are not depicted in FIGS. 6A-6B. As shown in FIG. 6B, a via 206 connects the second metal conductor 202 to the fifth metal conductor 205, which in turn is connected to a ground distribution conductor of a differential ground network. For clarity of the figures, the via 206 is omitted from the perspective view of FIG. 6A.

FIG. 6B has been annotated to show certain capacitors present in the conductor stack. For example, a capacitor C1A is formed between the fourth metal conductor 204 and the fifth metal conductor 205. Additionally, a capacitor C2A is formed between the second metal conductor 202 and the third metal conductor 203. Furthermore, a capacitor C3A is formed between the first conductor 201 and the second conductor 202.

In certain implementations, a differential power amplifier includes FETs, and the intermetal capacitors 210 are used to implement gate capacitors. For example, a first instantiation of the intermetal capacitors 210 can be used to implement the gate capacitors C1A, C2A, and C3A of FIG. 5A, and a second instantiation of the intermetal capacitors 210 can be used to implement the gate capacitors C1B, C2B, and C3B of FIG. 5A. Although various examples in which the intermetal capacitors 210 implement gate capacitors have been described, other configurations are possible, such as implementations in which a differential power amplifier includes bipolar transistors and the intermetal capacitors 210 serve as base capacitors.

The intermetal capacitors 210 include stacked capacitor structures, and thus high density can be achieved. Furthermore, presence of a ground layer aids in providing very good isolation at high frequencies.

Although the intermetal capacitors 210 illustrate one embodiment of capacitors suitable for use in a differential power amplifier, the differential power amplifiers herein can include other implementations of capacitors.

Figure 7A:
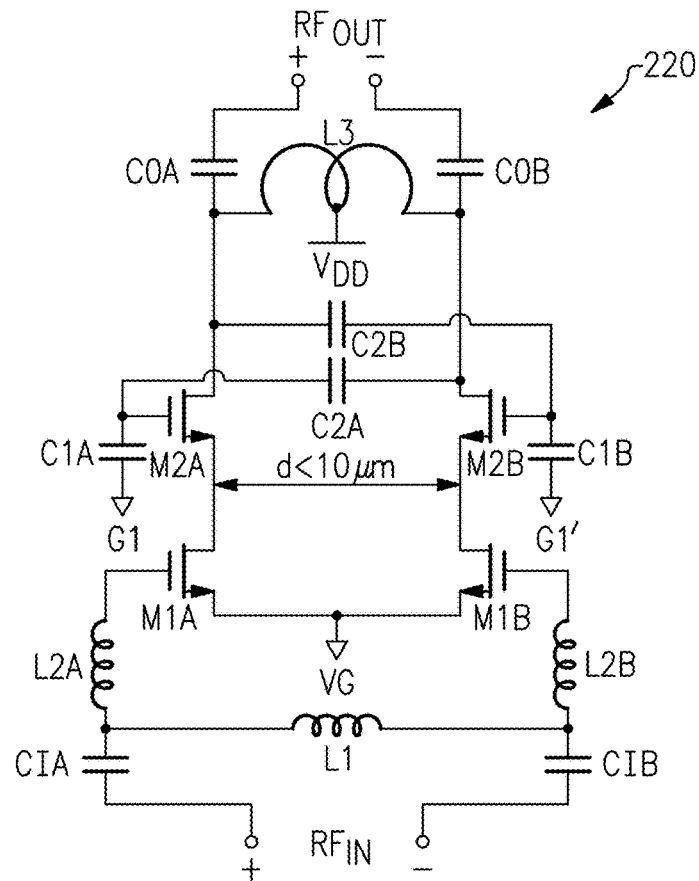
FIG. 7A is a schematic diagram of another embodiment of a differential power amplifier with differential ground.

FIG. 7A is a schematic diagram of another embodiment of a differential power amplifier 220 with differential ground. The differential power amplifier 220 receives a differential input signal $RF_{IN}$ including a first or non-inverted signal component and a second or inverted signal component. The first signal component is processed using a first half circuit of the differential power amplifier 220, and the second signal component is processed using a second half circuit of the differential power amplifier 220. The differential power amplifier 220 of FIG. 7A provides a differential output signal $RF_{OUT}$ including a first signal component from the first half circuit and a second signal component from the second half circuit.

In the illustrated embodiment, the first half circuit of the differential power amplifier 220 includes a first input capacitor CIA, a first input inductor L2A, a first gain FET M1A, a first cascode FET M2A, a first gate capacitor C1A, a first neutralization capacitor C2A, and a first output capacitor COA. Additionally, the second half circuit of the differential power amplifier 220 includes a second input capacitor CIB, a second input inductor L2B, a second gain FET M1B, a second cascode FET M2B, a second gate capacitor C1B, a second neutralization capacitor C2B, and a second output capacitor COB. Furthermore, an input inductor L1 is connected differentially across the input capacitors CIA and CIB, and an output inductor L3 is connected differentially across the output capacitors COA and COB. The output inductor L3 includes a center tap that receives a supply voltage VDD for supplying power to the differential power amplifier 220.

Although an example with one cascode FET per half circuit is illustrated, other implementations are possible, including, but not limited to, implementations using additional cascode FETs.

In the illustrated embodiment, the first gate capacitor C1A is connected between a gate of the first cascode FET M2A and a first point G1 of a differential ground network. Additionally, the second gate capacitor C1B is connected between a gate of the second cascode FET M2B and a second point G1' of the differential ground network. Points G1 and G1' are corresponding points of the differential ground network, such that the impact of parasitic inductive effects of conductors of the ground network are reduced or eliminated.

The first neutralization capacitor C2A is connected between the gate of the first cascode FET M2A and a drain of the second cascode FET M2B. Additionally, the second neutralization capacitor C2B is connected between the gate of the second cascode FET M2B and a drain of the first cascode FET M1B. Including the neutralization capacitors C2A and C2B enhances the performance and/or stability of the differential power amplifier 220. In certain implementations, the neutralization capacitors C2A and C2B are tuned with the gate capacitors C1A and C1B to provide frequency compensation to the poles associated with parasitic gate-to-drain capacitors (Cgd) of transistors M2A and M2B. By providing neutralization or compensation in this manner, the output gain of the transistors M2A/M2B is enhanced.

In one embodiment, the sources of the cascode transistors M2A, M2B are implemented in layout within about 10 μm of one another, thereby providing a further enhancement to device matching.

Figure 7B:
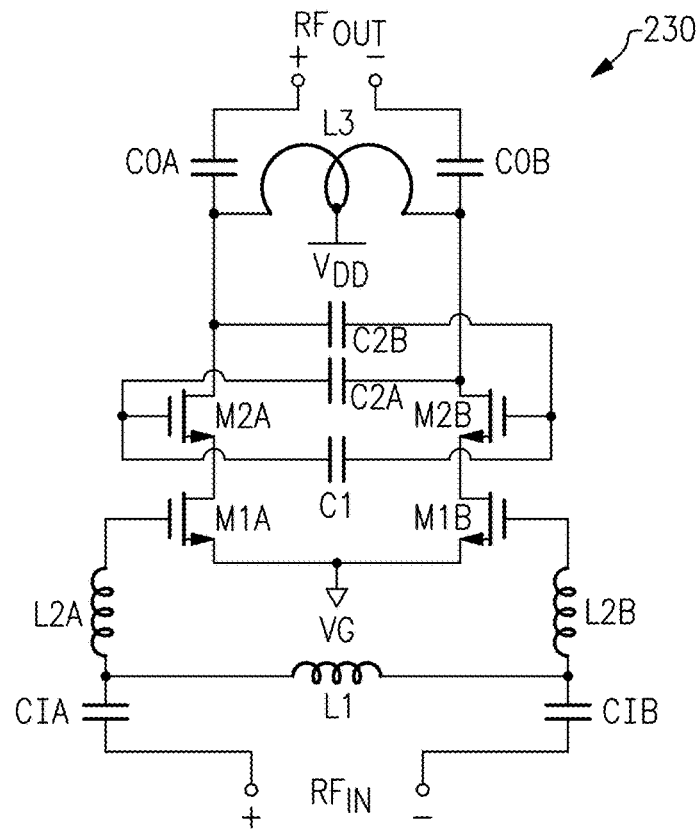
FIG. 7B is a schematic diagram of another embodiment of a differential power amplifier with differential ground.

FIG. 7B is a schematic diagram of another embodiment of a differential power amplifier 230 with differential ground. The differential power amplifier 230 of FIG. 7B is similar to the differential power amplifier 220 of FIG. 7A, except that the differential power amplifier 230 of FIG. 7B omits the gate capacitors C1A and C1B in favor of including a differential gate capacitor C1. As shown in FIG. 7B, the differential gate capacitor C1 is connected between the gates of the cascode FETs M2A and M2B.

In certain implementations, the differential gate capacitor C1 is about one-half the size of the gate capacitors C1A and C1B. Thus, the differential power amplifier 230 can be implemented with smaller area and without needing a ground reference voltage for the capacitors.

Figure 7C:
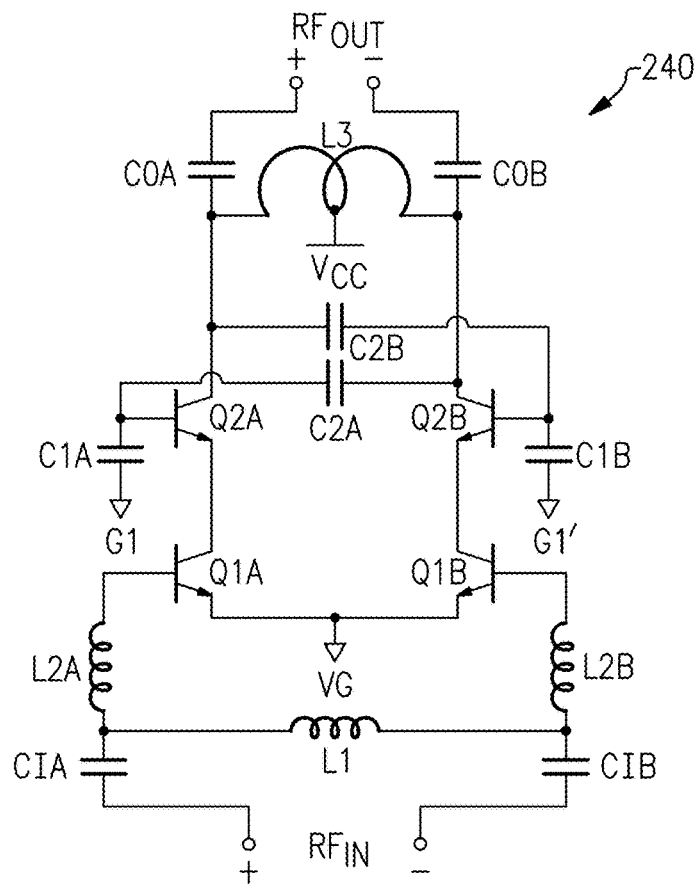
FIG. 7C is a schematic diagram of another embodiment of a differential power amplifier with differential ground.

FIG. 7C is a schematic diagram of another embodiment of a differential power amplifier 240 with differential ground. The differential power amplifier 240 includes a first half circuit including a first input capacitor CIA, a first input inductor L2A, a first gain bipolar transistor Q1A, a first cascode bipolar transistor Q2A, a first base capacitor C1A, a first neutralization capacitor C2A, and a first output capacitor COA. Additionally, the differential power amplifier 240 further includes a second half circuit including a second input capacitor CIB, a second input inductor L2B, a second gain bipolar transistor Q1B, a second cascode bipolar transistor Q2B, a second base capacitor C1B, a second neutralization capacitor C2B, and a second output capacitor COB. Furthermore, an input inductor L1 is connected differentially across the input capacitors CIA and CIB, and an output inductor L3 is connected differentially across the output capacitors COA and COB. The output inductor L3 includes a center tap that receives a supply voltage VDD for supplying power to the differential power amplifier 240.

The differential power amplifier 240 of FIG. 7C is similar to the differential power amplifier 220 of FIG. 7A, except that the differential power amplifier 240 is implemented with bipolar transistors rather than FETs. For example, the differential power amplifier 240 of FIG. 7C omits the first and second gain FETs M1A and M1B in favor of including first and second gain bipolar transistors Q1A and Q1B, respectively. Additionally, the differential power amplifier 240 of FIG. 7C omits the first and second cascode FETs Q2A and Q2B in favor of including first and second cascode bipolar transistors Q2A and Q2B, respectively.

The differential power amplifiers herein can be implemented with transistors of a wide variety of types. For example, a differential power amplifier can be implemented using FETs, bipolar transistors, or a combination thereof.

Figure 7D:
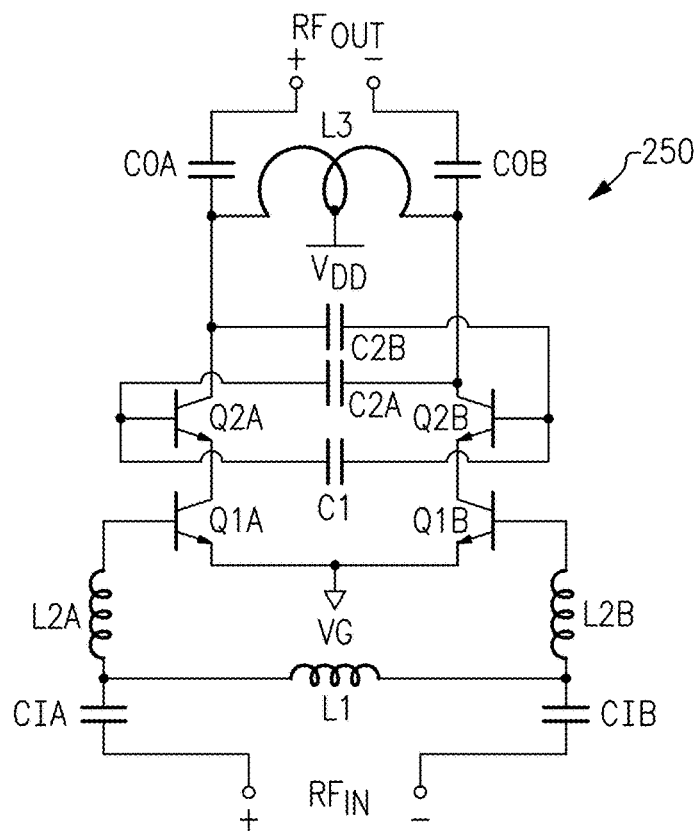
FIG. 7D is a schematic diagram of another embodiment of a differential power amplifier with differential ground.

FIG. 7D is a schematic diagram of another embodiment of a differential power amplifier 250 with differential ground. The differential power amplifier 250 of FIG. 7D is similar to the differential power amplifier 240 of FIG. 7C, except that the differential power amplifier 250 of FIG. 7D omits the base capacitors C1A and C1B in favor of including a differential base capacitor C1. As shown in FIG. 7D, the differential gate capacitor C1 is connected between the bases of the cascode bipolar transistors Q2A and Q2B.

Figure 8A:
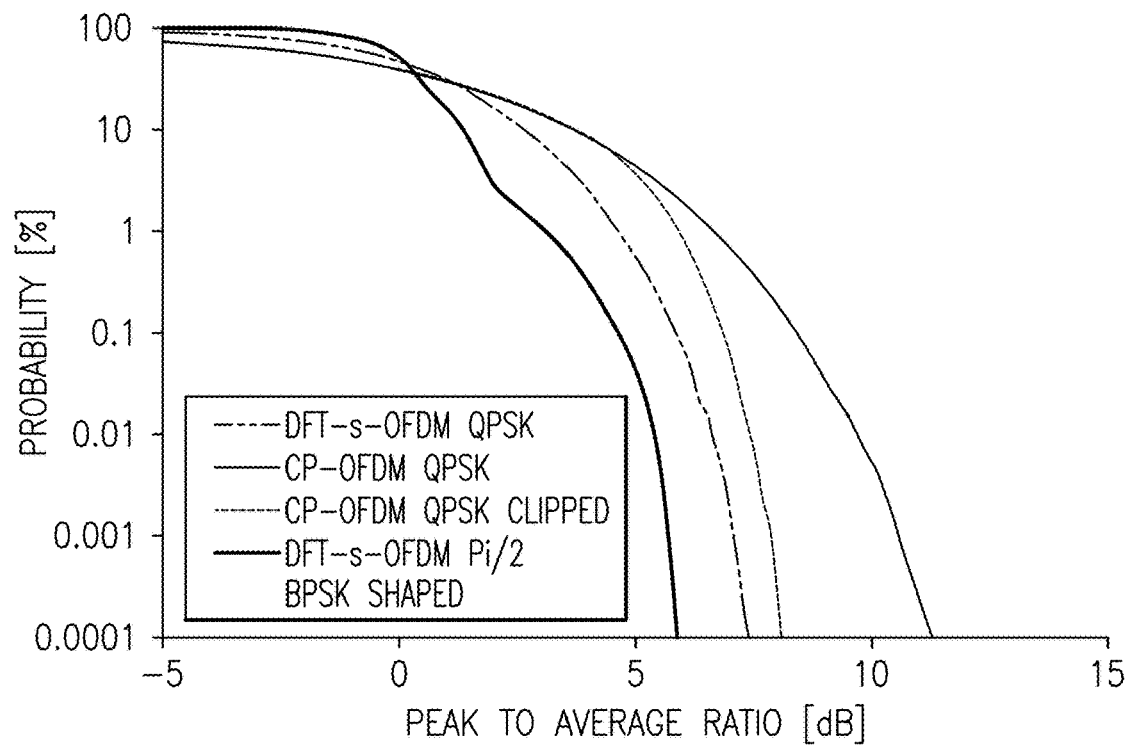
FIG. 8A is a graph of one example of cumulative probability percentage versus peak-to-average power ratio for a variety of waveforms.

FIG. 8A is a graph of one example of cumulative probability percentage versus peak-to-average power ratio (PAPR) for a variety of waveforms. The waveforms include a discrete Fourier transformation-spread-orthogonal frequency division multiplexing (DFT-s-OFDM) waveform using quadrature phase shift keying (QPSK) modulation, a cyclic prefix orthogonal frequency division multiplexing (CP-OFDM) waveform using QPSK, a CP-OFDM waveform using clipped QPSK, and a DFT-s-OFDM waveform using Pi/2 binary phase shift keying (BPSK).

Figure 8B:
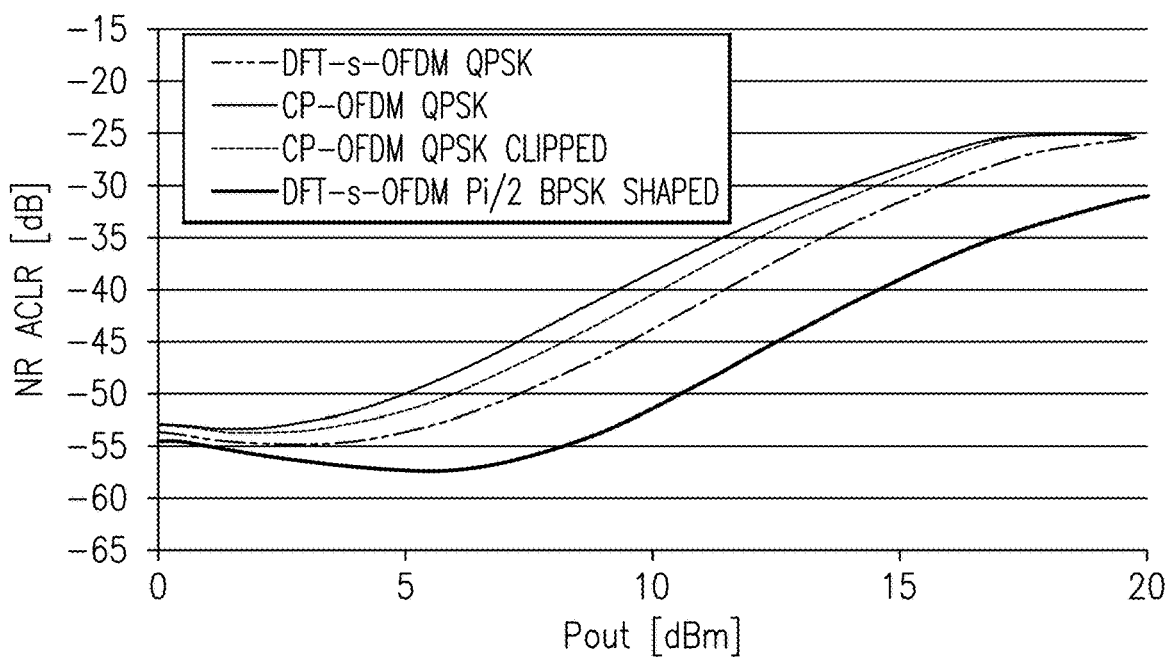
FIG. 8B is a graph of one example of adjacent channel leakage ratio (ACLR) versus output power for the waveforms of FIG. 8A.

FIG. 8B is a graph of one example of NR adjacent channel leakage ratio (ACLR) versus output power for the waveforms of FIG. 8A. The graph corresponds to simulated results for one implementation of a differential power amplifier system implemented using the configuration of FIGS. 5A and 5B. As shown in FIG. 8B, the ALCR versus output power slope is relatively similar across waveforms.

Although one example of simulation results has been shown, other simulations results are possible. For example, simulation results can vary based on a wide variety of factors, including, but not limited to, simulation parameters, power amplifier topology, power amplifier layout, and/or fabrication processes.

The differential power amplifiers disclosed herein are applicable to a wide variety of RF communication systems, including, but not limited to, smartphones, base stations, laptops, handsets, wearable electronics, and/or tablets.

Figure 9:
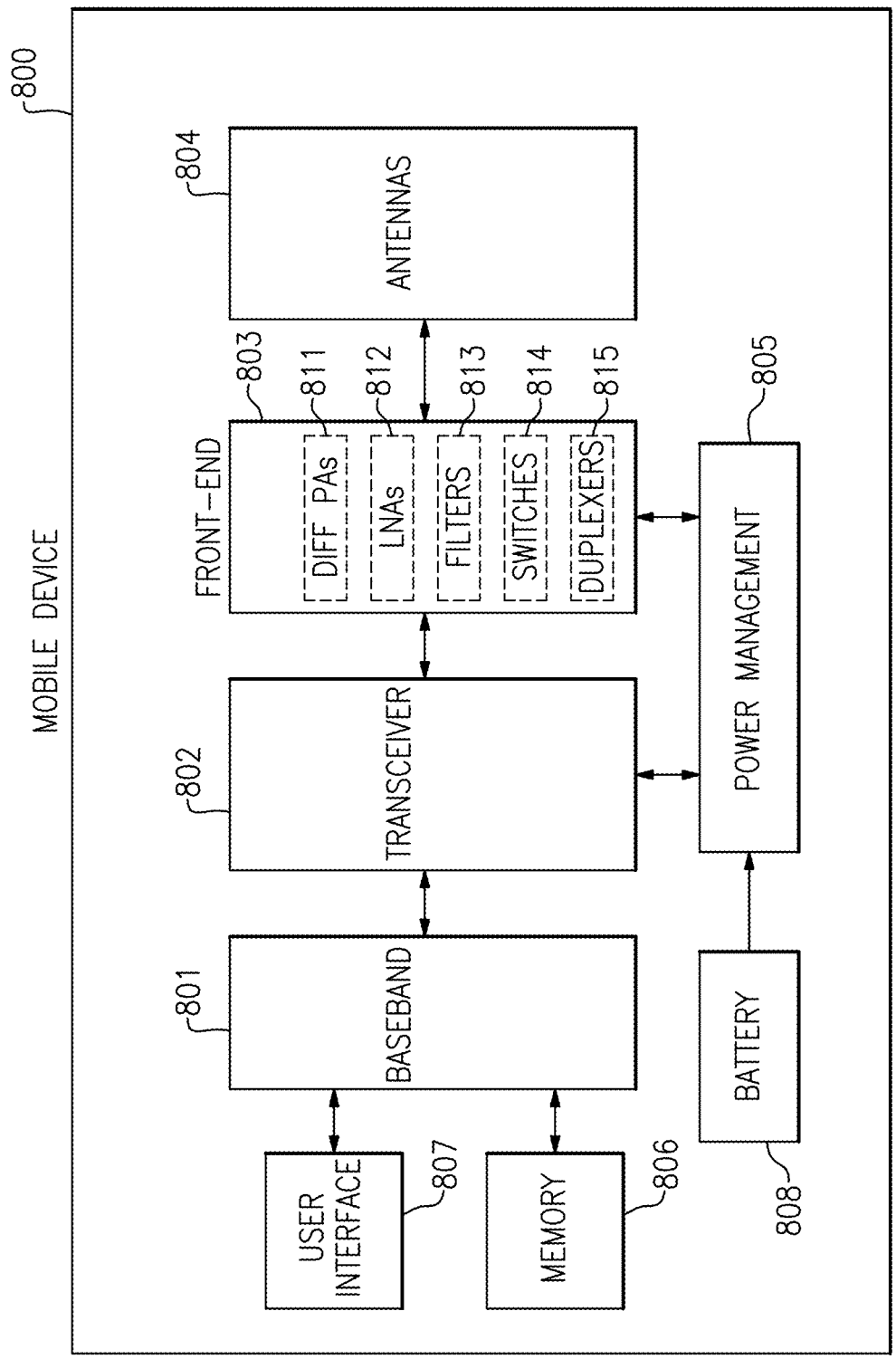
FIG. 9 is a schematic diagram of one embodiment of a mobile device.

FIG. 9 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 9 as the transceiver 802. In one example, separate components (for instance, separate circuits or dies) can be provided for handling certain types of RF signals. In certain implementations, the transceiver 802 includes the digital signal processing circuit 102 and/or one or more of the I/Q modulators 104a, 104b . . . 104n of FIG. 3.

The front-end system 803 aids is conditioning signals transmitted to and/or received from the antennas 804. In the illustrated embodiment, the front-end system 803 includes one or more differential power amplifiers (PAs) 811, one or more low noise amplifiers (LNAs) 812, one or more filters 813, one or more switches 814, and one or more duplexers 815. Although various example components of the front-end system 803 are shown in FIG. 9, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

Although FIG. 9 illustrates one example of an RF communication system that can include differential power amplifiers implemented in accordance with the teachings herein, differential power amplifiers can be used in other configurations of electronics.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beam forming in certain implementations. For example, the front-end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beam forming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 9, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the PA supply control circuit can be implemented to provide average power tracking (APT), envelope tracking (ET), and/or any other suitable supply control scheme. In other implementations, the supply voltage corresponds to a battery voltage, a fixed voltage, or other suitable supply voltage.

In one embodiment, the power management system 805 includes an envelope tracker for controlling a power amplifier supply voltage of at least one differential power amplifier of the differential power amplifiers 811 based on an envelope of an RF signal amplified by the differential power amplifier.

As shown in FIG. 9, the power management system 805 receives a battery voltage from the battery 808. The battery 808 can be any suitable battery for use in the mobile device 800, including, for example, a lithium-ion battery.

Figure 10A:
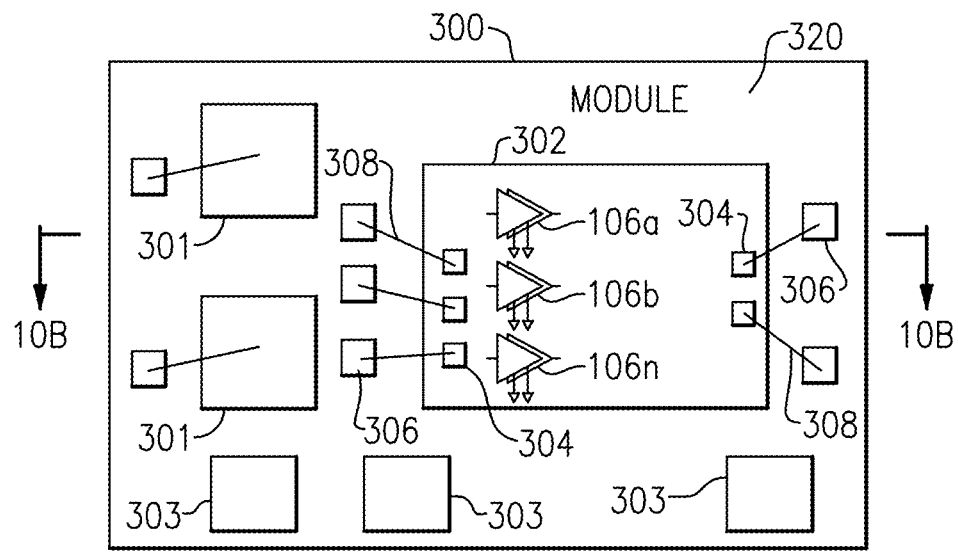
FIG. 10A is a schematic diagram of one embodiment of a packaged module.
Figure 10B:
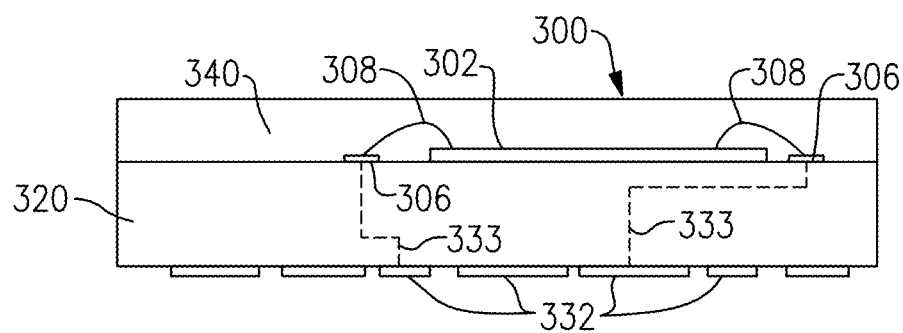
FIG. 10B is a schematic diagram of a cross-section of the packaged module of FIG. 10A taken along the lines 10B-10B.

FIG. 10A is a schematic diagram of one embodiment of a packaged module 300. FIG. 10B is a schematic diagram of a cross-section of the packaged module 300 of FIG. 10A taken along the lines 10B-10B.

The packaged module 300 includes semiconductor dies 301, a semiconductor power amplifier die 302, surface mount components 303, wirebonds 308, a package substrate 320, and encapsulation structure 340. The package substrate 320 includes pads 306 formed from conductors disposed therein. Additionally, the semiconductor power amplifier die 302 includes pins or pads 304, and the wirebonds 308 have been used to connect the pads 304 of the power amplifier die 302 to the pads 306 of the package substrate 301. A portion of the pads 304 correspond to ground pads that are configured to receive a ground voltage.

The semiconductor power amplifier die 302 includes a differential power amplifiers 106a, 106b . . . 106n, which can be implemented in accordance with one or more features disclosed herein. Although the illustrated semiconductor power amplifier die 302 includes three differential power amplifiers, more or fewer power amplifiers can be included on the power amplifier die 302 as indicated by the ellipses. The semiconductor power amplifier die 302 further includes at least one differential ground network for distributing ground from the ground pads to the differential power amplifiers 106a, 106b . . . 106n.

The packaging substrate 320 can be configured to receive a plurality of components such as the semiconductor dies 301, the semiconductor power amplifier die 302 and the surface mount components 303, which can include, for example, surface mount capacitors and/or inductors.

In certain embodiments, at least one of the semiconductor dies 301 includes a transceiver (for instance, the transceiver 802 of FIG. 9), a baseband processor (for instance, the baseband processor 801 of FIG. 9), a power management circuit (for instance, the power management circuit 805 of FIG. 9), front-end circuitry (for instance, one or more components of the front-end circuit 803 of FIG. 9), a digital signal processing circuit (for instance, the digital signal processing circuit 102 of FIG. 3), and/or an I/Q modulator (for instance, the I/Q modulators 104a, 104b . . . 104n of FIG. 3). Although FIG. 10A illustrates two dies 301, more or fewer of the dies 301 can be included. Moreover, each of the dies 301 can include different circuit fabricated thereon and/or can be manufactured using different processing technologies.

As shown in FIG. 10B, the packaged module 300 is shown to include a plurality of contact pads 332 disposed on the side of the packaged module 300 opposite the side used to mount the semiconductor power amplifier die 302. Configuring the packaged module 300 in this manner can aid in connecting the packaged module 300 to a circuit board, such as a phone board of a wireless device. The example contact pads 332 can be configured to provide radio frequency signals, bias signals, and/or power (for example, a power supply voltage and ground) to the semiconductor power amplifier die 302 and/or the surface mount components 303. As shown in FIG. 10B, the electrical connections between the contact pads 332 and the semiconductor power amplifier die 302 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Applications

Some of the embodiments described above have provided examples in connection with front end modules and/or wireless communication devices. However, the principles and advantages of the embodiments can be used for any other systems or apparatus that have needs for power amplifiers.

For example, power amplifiers can be included in various electronic devices, including, but not limited to consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a transceiver configured to generate a plurality of radio frequency input signals including a first radio frequency input signal and a second radio frequency input signal, the transceiver configured to control the plurality of radio frequency input signals to provide beam forming; and
a plurality of differential power amplifiers including a first differential power amplifier configured to provide amplification to the first radio frequency input signal and a second differential power amplifier configured to provide amplification to the second radio frequency input signal, the first differential power amplifier and the second differential power amplifier each configured to operate with differential ground so as to provide isolation between the first differential power amplifier and the second differential power amplifier.

2. The mobile device of claim 1 wherein the first differential power amplifier includes a pair of half circuits configured to receive a ground voltage such that an amount of parasitic inductance present between the ground voltage and each of the pair of half circuits is substantially equal.

3. The mobile device of claim 1 wherein the transceiver is configured to provide multi-input multi-output encoding to the plurality of radio frequency input signals.

4. The mobile device of claim 1 wherein the first radio frequency input signal and the second radio frequency input signal are of different signal types.

5. The mobile device of claim 1 further comprising an antenna array including a first antenna configured to receive a first amplified radio frequency signal from the first differential power amplifier and a second antenna configured to receive a second amplified radio frequency signal from the second differential power amplifier.

6. A packaged radio frequency module comprising:
   a package substrate; and
   a power amplifier die attached to the package substrate, the power amplifier die including a plurality of differential power amplifiers including a first differential power amplifier configured to provide amplification to a first radio frequency input signal and a second differential power amplifier configured to provide amplification to a second radio frequency input signal, the first differential power amplifier and the second differential power amplifier each configured to operate with differential ground to thereby provide isolation between the first differential power amplifier and the second differential power amplifier, the first differential power amplifier including a pair of half circuits configured to receive a ground voltage such that an amount of parasitic inductance present between the ground voltage and each of the pair of half circuits is substantially equal.

7. The packaged radio frequency module of claim 6 further comprising a semiconductor die attached to the package substrate and including a transceiver configured to generate a plurality of radio frequency input signals including the first radio frequency input signal and the second radio frequency input signal.

8. The packaged radio frequency module of claim 7 wherein the transceiver is configured to provide multi-input multi-output encoding to the plurality of radio frequency input signals.

9. The packaged radio frequency module of claim 7 wherein the transceiver is configured to control the plurality of radio frequency input signals to provide beam forming.

10. The packaged radio frequency module of claim 7 wherein the first radio frequency input signal and the second radio frequency input signal are of different signal types.

11. The packaged radio frequency module of claim 6 wherein the pair of half circuits have symmetric transistor layouts.

12. The packaged radio frequency module of claim 6 wherein the power amplifier die further includes a plurality of ground pads positioned symmetrically with respect to the pair of half circuits and configured to provide the ground voltage.

13. A radio frequency communication device comprising:
    a plurality of modulators configured to generate a plurality of radio frequency input signals including a first radio frequency input signal and a second radio frequency input signal;
    a digital signal processing circuit configured to provide the plurality of modulators with a plurality of in-phase digital signals and a plurality of quadrature-phase digital signals; and
    a plurality of differential power amplifiers including a first differential power amplifier configured to provide amplification to the first radio frequency input signal and a second differential power amplifier configured to provide amplification to the second radio frequency input signal, the first differential power amplifier and the second differential power amplifier each configured to operate with differential ground so as to provide isolation between the first differential power amplifier and the second differential power amplifier.

14. The radio frequency communication device of claim 13 wherein the digital signal processing circuit is configured to control multi-input multi-output encoding of the plurality of radio frequency input signals.

15. The radio frequency communication device of claim 13 wherein the digital signal processing circuit is configured to control beam forming of the plurality of radio frequency input signals.

16. The radio frequency communication device of claim 13 wherein the first radio frequency input signal and the second radio frequency input signal are of different signal types.

17. The radio frequency communication device of claim 13 wherein the first differential power amplifier includes a pair of half circuits configured to receive a ground voltage such that an amount of parasitic inductance present between the ground voltage and each of the pair of half circuits is substantially equal.

18. The radio frequency communication device of claim 17 wherein the pair of half circuits have symmetric transistor layouts.

19. The radio frequency communication device of claim 17 further comprising an antenna array including a first antenna configured to receive a first amplified radio frequency signal from the first differential power amplifier and a second antenna configured to receive a second amplified radio frequency signal from the second differential power amplifier.

20. The mobile device of claim 2 wherein the pair of half circuits have symmetric transistor layouts.

* * * * *